(12) United States Patent
El Outmani et al.

(10) Patent No.: US 12,123,915 B2
(45) Date of Patent: Oct. 22, 2024

(54) METHOD AND DEVICE FOR MEASURING, IN REAL TIME AND IN SITU, THERMODYNAMIC DATA OF A BATTERY (ENTHALPY AND ENTROPY)

(71) Applicant: INSTITUT POLYTECHNIQUE DE GRENOBLE, Grenoble (FR)

(72) Inventors: Sohaib El Outmani, Garges lès Gonesse (FR); Olivier Sename, Grenoble (FR); Pierre Granjon, Vinay (FR); Rachid Yazami, Singapore (SG)

(73) Assignee: INSTITUT POLYTECHNIQUE DE GRENOBLE, Grenoble (FR)

( * ) Notice: Subject to any disclaimer, the term of this patent is extended or adjusted under 35 U.S.C. 154(b) by 125 days.

(21) Appl. No.: 17/280,011

(22) PCT Filed: Sep. 26, 2019

(86) PCT No.: PCT/EP2019/076102
§ 371 (c)(1),
(2) Date: Mar. 25, 2021

(87) PCT Pub. No.: WO2020/064959
PCT Pub. Date: Apr. 2, 2020

(65) Prior Publication Data
US 2022/0034973 A1 Feb. 3, 2022

(30) Foreign Application Priority Data
Sep. 27, 2018 (FR) .................................. 1858919

(51) Int. Cl.
*G01R 31/382* (2019.01)
*G01R 31/367* (2019.01)
(Continued)

(52) U.S. Cl.
CPC ......... *G01R 31/382* (2019.01); *G01R 31/367* (2019.01); *H01M 10/48* (2013.01);
(Continued)

(58) Field of Classification Search
None
See application file for complete search history.

(56) References Cited

U.S. PATENT DOCUMENTS

2010/0090650 A1\* 4/2010 Yazami ............... H01M 10/443
324/426
2013/0322488 A1\* 12/2013 Yazami .................. B60L 58/27
374/100

(Continued)

OTHER PUBLICATIONS

Duong Van-Hu An et al: "Online state of charge and model parameters estimation of the LiFePO4 battery in electric vehicles using multiple adaptive forgetting factors recursive least-squares", Journal of Power Sources, Elsevier SA, CH, vol. 296, Jul. 24, 2015 (Jul. 24, 2015), pp. 215-224 (Year: 2015).\*

(Continued)

*Primary Examiner* — Brent A. Fairbanks
(74) *Attorney, Agent, or Firm* — HAUPTMAN HAM, LLP

(57) ABSTRACT

The invention relates to a method and a device for measuring, in real time and in situ, thermodynamic data of a battery (enthalpy and entropy). The object of the invention is to provide a reliable method for measuring, in situ, online and in real time, the variation in entropy (ΔS) of a battery. To this end, the method is characterized in that it consists primarily in: (phase I) producing a prior model of the battery: (a) charging the battery; (b) and/or discharging the battery; (c) measuring actual variables; (d) modeling the electrical behavior of the battery during charging (a) and/or discharging (b) in order to estimate the electrical parameters of the battery; (e) estimating electrical parameters of the battery;

(Continued)

(f) modeling the thermal behavior of the battery during charging (a) and/or discharging (b) in order to estimate ΔS in situ, online and in real time; (g) estimating ΔS, by using at least one of the electrical parameters estimated in step (d); (phase II) measuring ΔS of the battery during use in any application and with any state of charge by carrying out step (d) and step (f) of phase I, step (c) and step (g); (phase III) optionally storing the data measured/calculated in phase II and/or in phase I. The invention also relates to a method for determining the state of charge and the state of health of a battery on the basis of these thermodynamic data. Another subject of the invention is a device for implementing this method.

12 Claims, 18 Drawing Sheets

(51) Int. Cl.
 *H01M 10/48* (2006.01)
 *H01M 10/633* (2014.01)
 *H02J 7/00* (2006.01)
(52) U.S. Cl.
 CPC ....... *H01M 10/482* (2013.01); *H01M 10/633* (2015.04); *H02J 7/0048* (2020.01); *H02J 7/005* (2020.01)

(56) References Cited

U.S. PATENT DOCUMENTS

2016/0146895 A1* 5/2016 Yazami .................. H01M 10/48
 324/426
2017/0146608 A1 5/2017 Lee et al.
2018/0292465 A1* 10/2018 Osara ................. G01N 33/2888

OTHER PUBLICATIONS

Han et al., "A New SOH Prediction Model for Lithium-ion Battery for Electric Vehicles", 2014 17th International Conference on Electrical Machines and Systems (ICEMS),Oct. 22-25, 2014, Hangzhou, China (Year: 2014).*
A. Cuadras, F. Meinert, P. Büschel and O. Kanoun, "Online cell-phone battery entropy measurement for SoH estimation," 2016 13th International Multi-Conference on Systems, Signals & Devices (SSD), 2016, pp. 258-261 (Year: 2016).*
Duong et al., Van-Huan, "Online state of charge and model parameters estimation of the LifePO4 battery in electric vehicles using multiple adaptive forgetting factors recursive least-squares," Journal of Power Sources, 296 (2015) 215-224.
International Search Report and Written Opinion from corresponding International Application No. PCT/EP2019/076102, mailed Nov. 25, 2019, pp. 1-11, European Patent Office, Rijswijk, The Netherlands.

* cited by examiner

METHOD AND DEVICE FOR MEASURING, IN REAL TIME AND IN SITU, THERMODYNAMIC DATA OF A BATTERY (ENTHALPY AND ENTROPY)

TECHNICAL FIELD

The field of the invention is that of electrical batteries.

More precisely, the invention relates to a method for measuring in real time and in situ the thermodynamic data of a battery (enthalpy and entropy).

The invention also relates to a device for implementing this method.

STATE OF THE ART

The term battery designates an assembly of rechargeable accumulators connected together to obtain the desired capacity and voltage. An accumulator designates a unitary electrochemical device (cell) comprising two electrodes separated by an electrolyte. In the present disclosure, the term "battery" will designate both an assembly of electrochemical cells and a unit cell. Rechargeable batteries and in particular Li-Ion batteries are already present in a multitude of applications among which mention can be made of the storage of wind turbine or solar energy, mobile telephones, aircraft and automobiles. In this last sector where the market share of hybrid or electric vehicles should boom from 1% to 30% in the upcoming years, batteries will enjoy unprecedented rapid growth.

In all these applications, the diagnosis of batteries represents a major stake in terms of performance and safety. The news is rich in examples of problems concerning overheating, even fire or explosion of batteries.

It is therefore paramount to develop tools that make it possible to better diagnose the state of batteries, and in particular the state of charge and the state of health of batteries.

With the development perspectives mentioned hereinabove, an optimisation of the operation and of the safety of batteries, as minimal as it may be, could have a substantial impact. This optimisation entails improving the means of diagnosis of the internal state of batteries. It is known that there is a link between the internal state of a battery and the thermodynamic magnitudes that are associated with it, in particular the variation in enthalpy and the variation in entropy. Indeed, it has been observed that the thermodynamic profiles show a dependency with certain characteristics of the battery. These profiles depend on the thermal ageing, ageing through charging-discharging, ageing via overcharging but also on the state of charge of the battery. A modification in the profiles has also been observed in the case where the battery was overcharged. Knowledge of the thermodynamic data is therefore a rich source of information on the state and the past of a battery.

Moreover, it is essential to know the thermodynamics of the reactions at the electrodes and of the physical transformations of the batteries, in order to predict the performance and the stability of the batteries.

Thus, the energy density reflects the total quantities of charges exchanged in a reversible manner and the potential at which these exchanges take place. Furthermore, the life cycle refers to the stability of the states or phases that result from the transformations at the electrodes in the charging and discharging processes. These processes are controlled by the thermodynamics. There is therefore a link between the internal state of the battery and the thermodynamic magnitudes that are associated with it (variation in enthalpy and variation in entropy). The internal state of a battery is given in particular by the following characteristics: thermal ageing, ageing through charging-discharging, ageing via overcharging, state of the charge of the batter, overcharging. Knowledge of the thermodynamic data is therefore a rich source of information on the state and the past of a battery.

Many techniques have been developed and applied to evaluate the thermochemical kinetics of the reactions at the electrodes, in particular, electro-analytical methods (Cyclic voltametrics, potentiometry, etc.), spectroscopic techniques (X-ray diffraction, NMR, LEED, etc.).

Patent documents EP1924849, U.S. Pat. Nos. 8,446,127, 9,599,584, US20160146895, WO2017204750, among others, describe methods for evaluating the state of charge and the state of health of batteries, through the thermodynamic profiles measured.

In the prior art, the method for measuring thermodynamic profiles is a standard method that requires laboratory conditions and a significant amount of time of about several days to several weeks. This standard method also called the ETM method "Electro-chemical Thermodynamic Measurement", consists basically in implementing a device comprising:

1 A device making it possible to control the temperature of batteries
2 A potentiometer-galvanometer with a highly precise measurement of voltage and current
3 A computer for controlling the thermodynamic measurement process and collecting the data For measuring ΔS (the variation in entropy) with this device, the method ETM is based on the following formula:

$$\Delta S = F\left(\frac{\partial OCV}{\partial T_{bat}}\right)_x$$

where
ΔS is the variation in entropy
F is the Faraday constant
OCV is the open circuit voltage
$T_{bat}$ is the temperature of the battery
x is the state of charge In practice, to measure ΔS a given state of charge is used to start with, the current is cut off and several hours are allowed to pass so that the voltage at the terminals of the battery relaxes and tends to OCV. Then, the temperature of the battery is made to vary, which has an effect to vary the voltage. There is a linear relationship between $T_{bat}$ and OCV. It remains simply to determine the coefficient that links the two and to multiply it by the Faraday constant to obtain ΔS. To obtain a complete profile, the measurements must be reiterated at different states of charge.

OCV is obtained directly by measuring the voltage after relaxation and ΔH (the variation in enthalpy) is obtained using the equation (4)

$$\Delta H = -F \cdot OCV - T_{bat}\Delta S \tag{4}$$

It therefore appears that this standard measurement ETM of thermodynamic profiles is a laboratory technique that is meticulous, long, and requires a certain control of the operating conditions of the battery. This standard method ETM cannot be used in situ, online and in real time.

In these circumstances, the present invention aims to satisfy at least one of the objectives mentioned hereinafter.

One of the main objectives of the present invention is to provide a method for measuring, in situ, online and in real time, the variation in entropy of a battery.

One of the main objectives of the present invention is to provide a simple and reliable method of measuring, in situ, online and in real time, the variation in entropy of a battery.

One of the main objectives of the present invention is to provide an effective method for measuring, in situ, online and in real time, the variation in entropy of a battery.

One of the main objectives of the present invention is to provide a quick method for measuring, in situ, online and in real time, the variation in entropy of a battery.

One of the main objectives of the present invention is to provide an economical method for measuring, in situ, online and in real time, the variation in entropy of a battery.

One of the main objectives of the present invention is to provide an economical method for measuring, in situ, online and in real time, the variation in entropy of a battery, i.e. in conditions that are closer to the normal use of the battery.

One of the main objectives of the present invention is to provide a simple and effective method for diagnosing the state of charge and/or the state of health of batteries, from the variation in entropy measured by the method mentioned in the objectives hereinabove.

One of the main objectives of the present invention is to provide a simple and effective device for the implementation of the method mentioned in the objectives hereinabove.

BRIEF DESCRIPTION

These objectives, among others, are reached by the present invention which firstly relates to a method for measuring online and in situ, the variation in entropy $\Delta S$ of at least one battery, characterised in that it consists primarily in:

(Phase I) Producing a prior model of the battery of which the state of charge (SOC: "State Of Charge") is comprised between 0 and 100% by implementing the following steps:
(a) charging the battery at least partially with a charge current signal Sc;
(b) and/or discharging the battery at least partially with a discharge current signal Sd;
(c) Measuring actual variables useful in the following steps;
(d) Modelling the electrical behaviour of the battery during charging (a) with a charge current signal Sc and/or discharging (b) with a discharge current signal Sd, in order to estimate the electrical parameters of the battery;
(e) Estimating periodically, at a frequency Fe, electrical parameters of the battery;
(f) Modelling the thermal behaviour of the battery during charging (a) with a charge current signal Sc and/or discharging (b) with a discharge current signal Sd, in order to estimate in situ, online and in real time, at least one of the parameters of the thermal model, namely $\Delta S$;
(g) Estimating periodically, at a frequency Fg, at least one of the parameters of the thermal model, in particular $\Delta S$, by using at least one of the electrical parameters estimated in step (e);

(Phase II) Measuring thermodynamic data, in particular $\Delta S$, of the battery during use in an application and with any state of charge, by implementing the electrical [step (d)] and thermal [step (f)] models of the phase I, estimating electrical parameters [step (e)] and estimating at least one of the parameters of the thermal model, in particular $\Delta S$ [step (g)];

(Phase III) Optionally storing the data measured/calculated in phase II and/or in phase I.

This method therefore makes it possible to estimate a large number of parameters of the batter considered, it makes it possible in particular to estimate the electromotive force (open circuit voltage-OCV), the variation in entropy $\Delta S$ and therefore the variation in enthalpy $\Delta H$. Beyond these parameters, this method also makes it possible to estimate the internal resistance and the heat capacity of the battery.

This method is particularly advantageous in that it makes it possible to measure online, in real time and in situ the parameters of a battery during use, for example in an electric vehicle.

Once, for example, the variation in entropy is estimated, it is possible to estimate the state of health of the battery, basic knowledge for correct management of the battery.

It is thus in another of its aspects, the present invention relates to a method for determining the state of charge (SOC) and/or the state of health (SOH) of a battery from $\Delta S$ and/or from $\Delta H$ measured by the method according to the invention.

The present invention also relates to a device for implementing the method for measuring the variation in entropy according to the invention.

Definitions

In all of the present disclosure, any singular designates indifferently a singular or a plural. The definitions given hereinafter as examples, can be used to interpret the present disclosure:

"measurement of thermodynamic data in situ": In-site measurement refers to a measurement during the use of the battery in an application, for example: battery used in an electric vehicle. This is in opposition with a measurement that would take place in a laboratory context.

"measurement of thermodynamic data online": The online measurement is a measurement that estimates the parameters or the states of a model [electrical model step (d) or thermal model step (f)], when new data is available during the use of the battery in an application.

"battery": unitary electrochemical device (cell) comprising two electrodes separated by an electrolyte or assembly of accumulators connected together in order to obtain the desired capacity and voltage.

"about" or "substantially" means plus or minus 10%, even plus or minus 5%, with respect to the measurement unit used.

"comprised between Z1 and Z2" means that one and/or the other of the limits Z1, Z2 is included or not in the interval [Z1, Z2].

DETAILED DESCRIPTION

This description is given in reference to the accompanying figures wherein.

Method For Measuring the Variation in Entropy ΔS

Phase I of Modelling

Phase I of modelling of the method according to the invention advantageously comprises the following steps:

Step ($a_0$) optional but however preferred: pre-estimation of the parameters $mC_p$ and hA Step (a) charging the battery with a charge current signal Sc Step (b) and/or discharging the battery with a discharge current signal Sd Step (c) measurement of the actual variables Step (d) electrical modelling Step (e) estimation of the electrical parameters Step (f) thermal modelling Step (g) estimation gf the thermodynamic parameters For modellings (d) and (f), step (a) of charging and/or step (b) of discharging operate in parallel, i.e. simultaneously, with steps (c) to (g).

In an embodiment comprising a step (b) of at least partial discharging during which steps (c) to (g) are implemented, in accordance with the invention, a step (a) of complete charging of the battery is provided beforehand.

According to an alternative of this embodiment, prior step (a) is a partial charging of the battery.

In another embodiment comprising a charging step (a) during which steps (c) to (g) are implemented, in accordance with the invention, a step (b) of completely discharging the battery is provided beforehand.

According to an alternative of this embodiment, prior step (b) is a partial discharging of the battery.

Independently of their increasing alphabetic referencing, steps (c) to (g) are not necessarily successive.

Thermo-Electrical Model [Steps (d) & (f)]

The approach retained by the invention to estimate the thermodynamic data of a battery consists of choosing a simple thermoelectrical representation of the system comprising the battery.

This thermoelectrical representation, which also has the advantage of being able to be applied to a large variety of batteries, is comprised of an electrical model [Step (d)] and of a thermal model [Step (f)].

Figure 1:
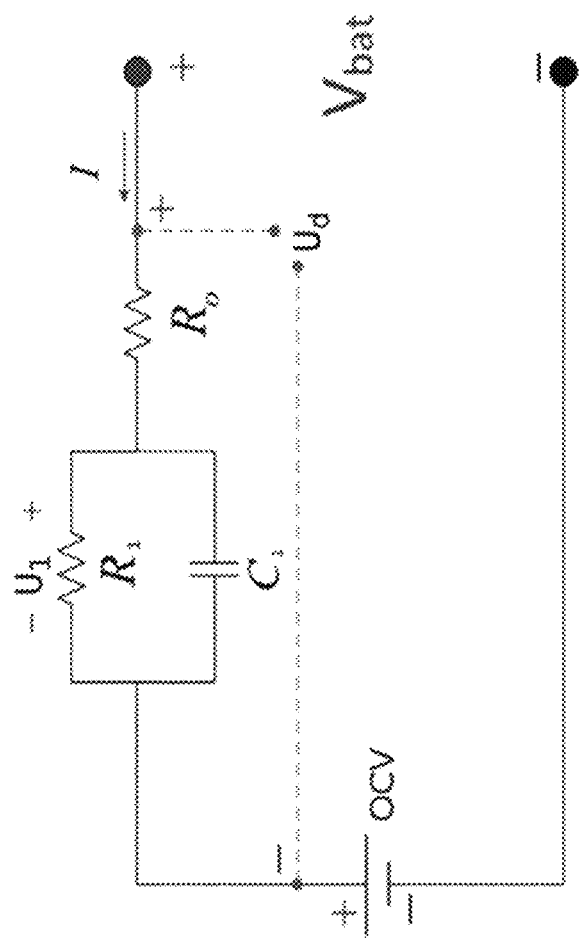
FIG. 1 is a diagram of the electrical model implemented in step (d) of the method according to the invention.

The electrical model makes it possible to estimate the electrical parameters of the battery such as the internal resistance and the electromotive force. It is advantageously based on the model called "Thevenin model" which considers the battery as a resistance in series with a circuit RC. As shown in FIG. 1, this model consists of a resistor $R_0$, an open circuit voltage OCV and a circuit $R_1C_1$ in series.

In this model, the electrical behaviour of the battery is also described by the following equations:

$$\begin{cases} \dot{U}_1 = -\dfrac{1}{C_1 R_1} U_1 + \dfrac{1}{C_1} I & (1) \\ V_{bat} = OCV + U_1 + R_0 I & (2) \end{cases}$$

where $U_1$ is the voltage at the terminals of the circuit RC, I is the current passing through the battery and $V_{bat}$ the voltage at the terminals of the battery.

The equations are then discretised in the same way as in "V.-H. Duong, H. A. Bastawrous, K Lim, K W. See, P. Zhang, and S. X. Dou, *Online state of charge and model parameters estimation of the LiFePO4 battery in electric vehicles using multiple adaptive forgetting factors recursive least-squares*," JOURNAL OF POWER SOURCES, vol. 296, pp. 215-224, Nov. 20 2015". The following is obtained:

$$V_{bat,k} = I_k b_{0,k} + I_{k-1} b_{1,k} + a_{1,k}(OCV_{k-1} - V_{bat,k-1}) + OCV_k \quad (2')$$

which can be rewritten:

$$V_{bat,k} = \Theta_k^T \Phi_k \quad (2'')$$

with:

$$\begin{cases} \Theta_k^T = [\, b_{0,k} \quad b_{1,k} \quad a_{1,k} \quad OCV_k \,] \\ \Phi_k^T = [\, I_k \quad I_{k-1} \quad (OCV_{k-1} - V_{bat,k-1}) \,] \end{cases}$$

-continued where:

$$\begin{cases} b_0 = R_0 \\ b_1 = -R_0 + \dfrac{T_s}{C_1} + \dfrac{T_s R_0}{C_1 R_1} \\ a_1 = \dfrac{T_s}{C_1 R_1} - 1 \end{cases} \quad (5)$$

$T_s$ is the sampling period.

$\Theta_k^T$ is the parameter vector, by identifying this vector it is then possible to estimate a value of $R_0$ and OCV.

In accordance with a preferred disposition of the implementation of the invention, OCV is used in the thermal model.

The thermal model makes it possible to estimate with precision the thermodynamic parameters of the battery such as the variation in entropy and this, continuously and without specific control of the conditions of use.

This thermal model is in particular based on the fact that the heat given off or absorbed by the battery mainly comes from 2 phenomena:

The joule effect and the variation in entropy. Indeed, the battery having an internal resistance, it produces heat when the current passes, during charging or discharging.

Moreover, the heat can be absorbed or emitted according to the sign of the variation in entropy and the current passing through the battery. A heat exchange also occurs between the battery and its environment.

Modelling step (f) consists of considering the battery as a thermal model wherein the battery, on the one hand, is subjected to a charge current Sc able to be subjected to a sampling or to a discharge current Sd able to be subjected to a sampling, and, on the other hand, is a heat exchanger with its environment and wherein the thermal behaviour of the battery is described by the following equation:

$$mC_p \frac{dT_{bat}}{dt} = I(V_{bat} - OCV) + IT_{bat}\frac{\Delta S}{F} + hA(T_{bat} - T_{amb}) \quad (3)$$

where:

m is the mass of the battery
$C_p$ is the heat capacity of the battery
$T_{bat}$ is the temperature of the battery
t is the time variable
I is the current passing through the battery
$V_{bat}$ is the voltage at the terminals of the battery
OCV is the open circuit voltage of the battery
$\Delta S$ is the variation in entropy of the battery
F is the Faraday constant
h is the thermal exchange coefficient with the exterior
A is the area of the battery in contact with the exterior
$T_{amb}$ is the temperature of the outside environment
The equation (3) is then discretised:

$$T_{bat,k} - T_{bat,k-1} = a_{0,k}[I_k(V_{bat,k} - OCV_k)] + a_{1,k}I_k T_{bat,k} + a_{2,k}(T_{bat,k} - T_{amb,k}) \quad (4)$$

which can be rewritten:

$$T_{bat,k} = T_{bat,k-1} = \Theta_k^T \Phi_k \quad (5)$$

-continued with:

$$\begin{cases} \Theta_k^T = [\, a_{0,k} \quad a_{1,k} \quad a_{2,k} \,] \\ \Phi_k^T = [\, I_k(V_{bat,k} - OCV_k) \quad I_k T_{bat,k} \quad T_{bat,k} - T_{amb,k} \,] \end{cases}$$

where:

$$\begin{cases} b_0 = \dfrac{T_s}{mC_p} \\ b_1 = \dfrac{T_s \Delta S}{mC_p F} \\ a_1 = \dfrac{T_s hA}{mC_p} \end{cases} \text{soit} \begin{cases} mC_p = \dfrac{T_s}{a_0} \\ \Delta S = \dfrac{a_1 F}{a_0} \\ hA = \dfrac{a_2}{a_0} \end{cases}$$

$T_s$ is the measurement sampling period.

In an alternative, R can be used in place of or as a supplement to OCV in the thermal model.

The two models proposed can be written as a linear combination of measured magnitudes. It is therefore possible to apply algorithms such as the least-squares one to estimate the coefficients of this linear combination and therefore the parameters.

This method therefore makes it possible to estimate a large number of parameters of the battery considered, it makes it possible to estimate the electromotive force, the variation in entropy and therefore the variation in enthalpy. Beyond these parameters, this methodology also makes it possible to estimate, among other things, the internal resistance, the heat capacity of the battery, the state of charge and the state of health of the battery.

Step ($a_0$) optional but however preferred: pre-estimation of the parameters $mC_p$ and hA In a preferred implementation of the invention, the products $mC_p$ and hA are considered as constants with respect to the state of charge and the state of health of the battery.

It is therefore advantageous to estimate these two parameters once and for all and to use these values in the electrical model according to the invention, for a given battery.

This pre-estimation basically consists of:

Implementing a relaxation of a duration (variable according to the batteries) comprised between 10 min and 60 min of the battery so that the parameter OCV of the equation (0) of the electrical model, has a precise given value;

Applying an periodical input electrical signal $S_e$ of which the period is chosen in such a way that the average of the heat generated by $\Delta S$ over a period is about 0, $S_e$ preferably being a square signal with a period comprised between 10 and 30 seconds, ideally of about 20 seconds, this square signal preferably being zero average;

Estimating the products $mC_p$ and hA, preferably using a recursive least-squares algorithm, thanks to the equation (3) that has become the following equation (3'):

$$mC_p \frac{dT_{bat}}{dt} = I(V_{bat} - OCV) + hA(T_{bat} - T_{amb}) \quad (3')$$

and by measuring actual variables that correspond to the parameters $V_{Bat}$, I, $T_{bat}$, $T_{amb}$;

integrating this estimation of the products $mC_p$ and hA into the thermal model for steps (f) & (g).

The period of relaxation of the voltage of the battery can be about ten minutes.

There is thus a precise value of OCV.

A recursive least-squares algorithm (RLS algorithm) is then preferably used to estimate these two parameters.

Step (a) Charging the Battery with a Charge Current Signal Sc

For the implementation of the charging step (a), a charge current Sc is repetitively applied, of which the frequency range is comprised between 0 and 1 Hz, preferably a signal corresponding to a Pseudo Random Binary Sequence—PRBS—, chosen in such a way that the "C rate" (C: capacity of the battery) of the battery is comprised between 0.01C and 3C, preferably between 1C and 2.5C, and, more preferably between 0.2C and 2C.

This can correspond for example, for a given lithium battery, to a charge current Sc, the intensity of which is for example comprised between 0 and 1 A.

According to an advantageous modality of the invention, the charge current Sc is sampled every second.

Step (b) Discharging the Battery with a Discharge Current Signal Sd

For the implementing of the discharging step (b), a discharge current Sd is repetitively applied of which the frequency range is comprised between 0 and 1 Hz, preferably a signal corresponding to a Pseudo Random Binary Sequence—PRBS, chosen in such a way that the "C rate" (C: capacity of the battery) of the battery is comprised between 0.01C and 3C, preferably between 0.1C and 2.5C, and, more preferably between 0.2C and 2C.

This can correspond for example, for a given lithium battery, to a discharge current Sd, the intensity of which is for example comprised between 0 and −1 A.

According to an advantageous modality of the invention, the discharge current Sd is sampled every second.

Step (c) Measurement of Actual Values

The actual variables measured in step (c) advantageously correspond to the parameters, $V_{Bat}$, $I$, $T_{bat}$, $T_{amb}$ of the electrical and thermal models.

Step (d) Electrical Modelling/Step (f) Thermal Modelling

Confer supra.

Step (e) Estimation of the Electrical Parameters/Step (g) Estimation of the Thermodynamic Parameters According to a remarkable characteristic of the invention, step (e) is carried out using a recursive least-squares algorithm and the estimating according to step (g) is carried out using a recursive least-squares algorithm.

For the estimating of the electrical parameters of step (e), the battery is charged and discharged in accordance with steps (a) & (b).

The parameters of the electrical model preferably taken into account are $R_0$ and OCV. $R_0$ is a parameter used for an estimation of the ageing of the battery. OCV is used for the thermal model, to estimate $\Delta S$.

The RLS algorithm is then applied to the data to estimate the parameters of the model. The parameters are updated every 0.2 seconds.

For the estimating of $\Delta S$, the RLS algorithm is preferably applied on the data linked to the thermal model.

Figure 2:
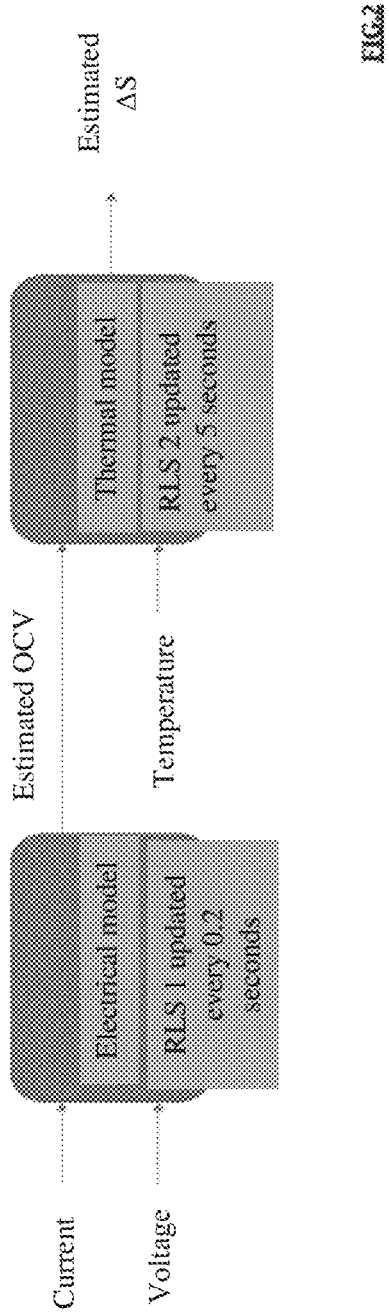
FIG. 2 is a block diagram of the use of 2 recursive least-squares RLS algorithms in steps (e) & (g) for periodic estimation, respectively.

As shown in FIG. 2, two algorithms RLS work at the same time. The first, as said hereinabove will estimate OCV from the current and the voltage. This estimation will be used by a second RLS algorithm based on the thermal model and using the temperature for the purpose of estimating $\Delta S$. Note that as the electrical dynamics are much faster than the thermal dynamics, the frequency used to update the electrical parameters is higher than for the thermal parameters.

It is also possible to obtain an estimation of the enthalpy $\Delta H$ from OCV and $\Delta S$ in the following way:

$$\Delta H = -F \cdot OCV - T_{bat} \Delta S \quad (6)$$

The estimation of the electrical parameter OCV and of the thermodynamic parameters ($\Delta S$ and $\Delta H$) is thus carried out in real time with a recursive algorithm.

In another of its aspects, the invention relates to a method for determining the state of charge and/or the state of health of a battery from $\Delta S$ and/or from $\Delta H$.

For the estimation of the SOC: It is demonstrated that for a given value of the SOC, a unique value pair ($\Delta S$ and $\Delta H$) corresponds. If the latter are estimated, then the SOC can also be estimated, which is why a real time estimate is important. A simple embodiment is the estimation of the SOC by considering the latter as a linear combination of $\Delta S$ and $\Delta H$. The SOC can be written SO (%)=$\alpha \Delta S + \beta \Delta H + \gamma$ with $\alpha$, $\beta$ and $\gamma$ parameters to be determined for a given battery. To determine the latter, the thermodynamic magnitudes $\Delta S$ and $\Delta H$ are measured for a given battery from 0 to 100%. Then the relationship between $\Delta S$, $\Delta H$ and SOC is determined such that SO (%)=$\alpha \Delta S + \beta \Delta H + \gamma$. $\alpha$, $\beta$ and $\gamma$ are preferably determined by the least-squares method. For an example of such a method, reference can be made to patent application US2016146895 A1.

For the estimating of the SOH, it is possible to estimate an indicator SOH based on the energy of a battery from its thermodynamic profiles thanks to "machine learning" tools.

For example, Lithium-ion electrochemical cells of the 18650 type (height: 65 mm and diameter 18 mm) undergo an ageing via cycling (successive charging-discharging). The ageing of the cells is carried out at 1.5 C-rate and at 55° C. Measurements are taken at different stages of ageing of an SOH indicator based on the energy of the battery and different thermodynamic magnitudes. The latter are measured by the standard method ETM. It was possible to establish in what follows a link between one of the thermodynamic magnitudes, $\Delta S$, and the indicator SOH based on the energy with "machine learning" tools. An example of a machine learning algorithm used to connect them is multiple linear regression. The indicator SOH is estimated as a linear combination of $\Delta S$ at certain values of SOC or OCV.

According to an embodiment, implementing step (e) makes it possible to estimate, at a frequency Fe comprised between 0 and 10 Hz, preferably of about 1 Hz, R0 and OCV according to the state of charge of the battery.

According to an embodiment and in that the implementation of step (g) makes it possible to estimate, at a frequency Fg comprised between 0 and 1 Hz, preferably of about 0.2 Hz, $\Delta S$ according to the state of charge of the battery, Phase II of Measuring This measurement phase II in situ, during the use of the battery in a given application, for example supplying an electric vehicle with power, takes place after the phase I of theoretical modelling.

The method is generally interrupted for a certain time between phase I and phase II.

Phase III of Storing

This optional phase III of storing the data measured/calculated during phase II takes place preferably simultaneously to this phase II.

According to an alternative, this data can be (tele)transmitted by any suitable means to the analysis and processing centre.

The data collected in situ can be used to improve the modelling.

Device for Implementing
  i. Charger/discharger: this is an element capable of charging and of discharging the battery in a programmable way. In an embodiment, this charger/discharger is an evaluation model FRDM-BC3770-EVM of the company NXP. The maximum charge current is 2 A and the maximum discharge current 1 A. The charger is mounted with a microcontroller, which makes it possible to have control over the current profile. In addition, this microcontroller proposes 16-bit analogue-to-digital converters, which allows for high-resolution measurements.
  ii. Actual variable sensors:
    $T_{bat}$ the battery temperature measurement sensor is advantageously a thermistor that makes it possible to measure the temperature with high resolution. This can be for example a 10 KΩ thermistor connected to the evaluation model BC3770. This thermistor has a 16-bit analogue-to-digital converter, and offers a resolution in temperature of 0.01° C. with acceptable noise.
    The evaluation module also makes it possible to measure $V_{bat}$ as well as the current of the batteries. These are native functions of the module. Regarding $T_{amb}$, it is measured using a thermistor connected to the analogue-to-digital converters of the microcontroller.
  iii. Data recorder
  iv. Charge current signal generator
  v. Central control and calculation unit
These 3 elements iii., iv. & v. can be gathered together in a single-card nano-computer with an ARM processor, of the raspberry pi 3 type.

Example

The example that follows shows a preferred embodiment of the method according to the invention, on a lithium-Ion battery.

Battery: cylindrical 18650 Lithium-Ion battery (diameter: 18 mm, height: 65 mm), with a nominal capacity of 3070 mAh.

The device according to the invention used in this example is the one described hereinabove.

Figure 3:
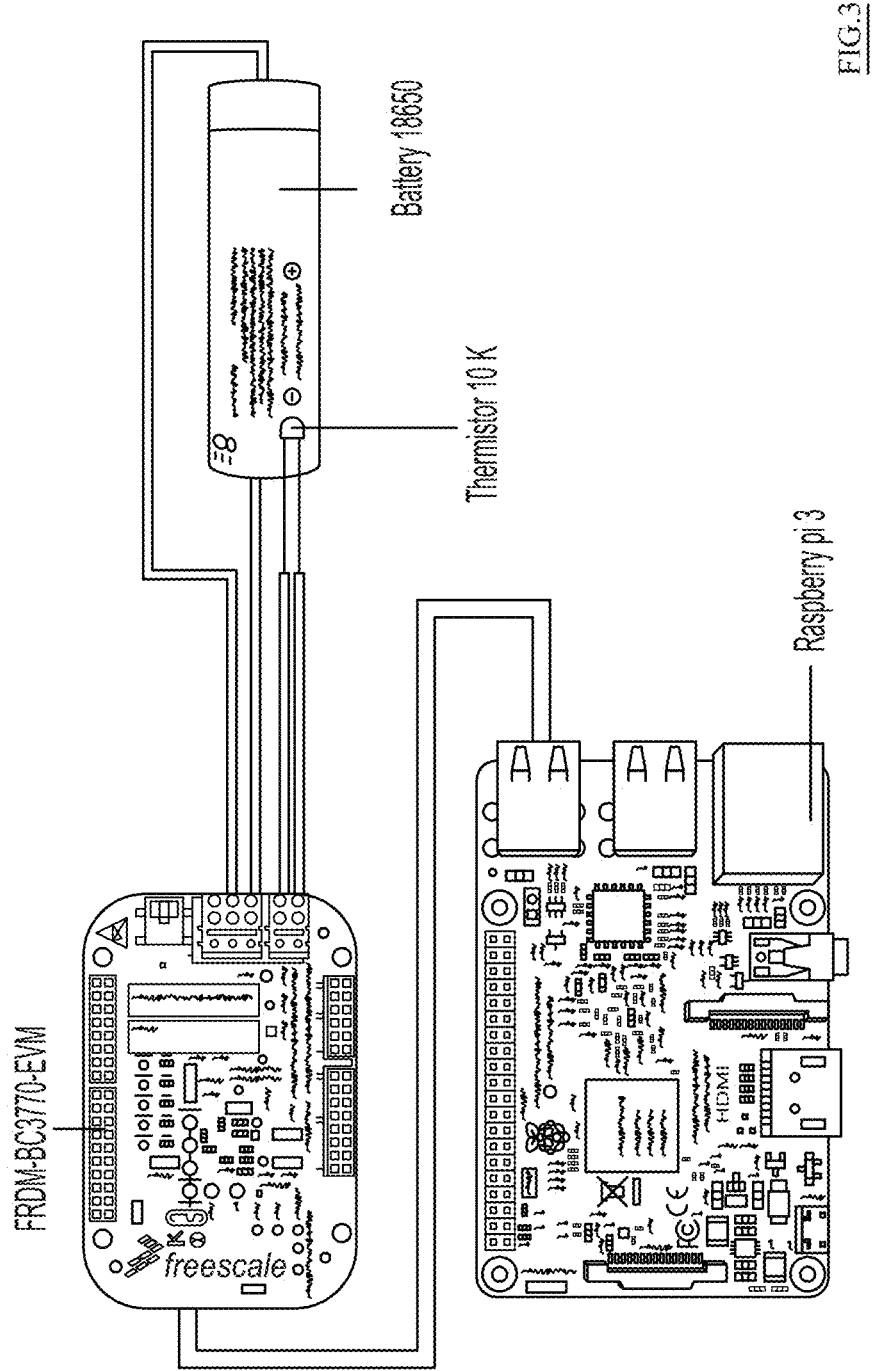
FIG. 3 is a diagram of the test bench used in the embodiment of the method according to the invention.

FIG. 3 shows the test bench comprising this device and the battery.

This test bench is placed in an environmental chamber in order to be able to control the temperature of the air around the battery and prevent unnecessary disturbances.

The thermistor is put in contact with the battery with a fluid that favours thermal contact, namely in this example the silicone grease marketed by the company VELLEMAN. In addition, it is thermally isolated from the outside environment using synthetic rubber.

It is therefore considered that the temperature measured is the surface temperature of the battery.

Step ($a_0$) Pre-Estimation of Parameters $mC_p$ and hA

In our thermo-electric model, the two parameters $mC_p$ and hA are considered as constants with respect to the state of charge and the state of health of the battery.

These two parameters are determined once and for all and are used in the electrical and thermal models for a given battery.

To estimate these parameters, a square signal is applied, of zero average, of ±1 A with a period of 20 seconds. Thus, the influence of the heat generated by the variation in entropy is overcome, indeed over a period the average of the heat generated by ΔS is equal to zero.

$$mC_p \frac{dT_{bat}}{dt} = I(V_{bat} - OCV) + hA(T_{bat} - T_{amb}) \quad (3')$$

The square signal is applied, after a period of relaxation of the voltage of the battery for about ten minutes. A precise value of OCV is therefore obtained. Only two unknown parameters remain in the equation (3'): $mC_p$ and hA.

The test bench described hereinabove is then used as well as the RLS algorithm to estimate these two parameters.

Figure 4:
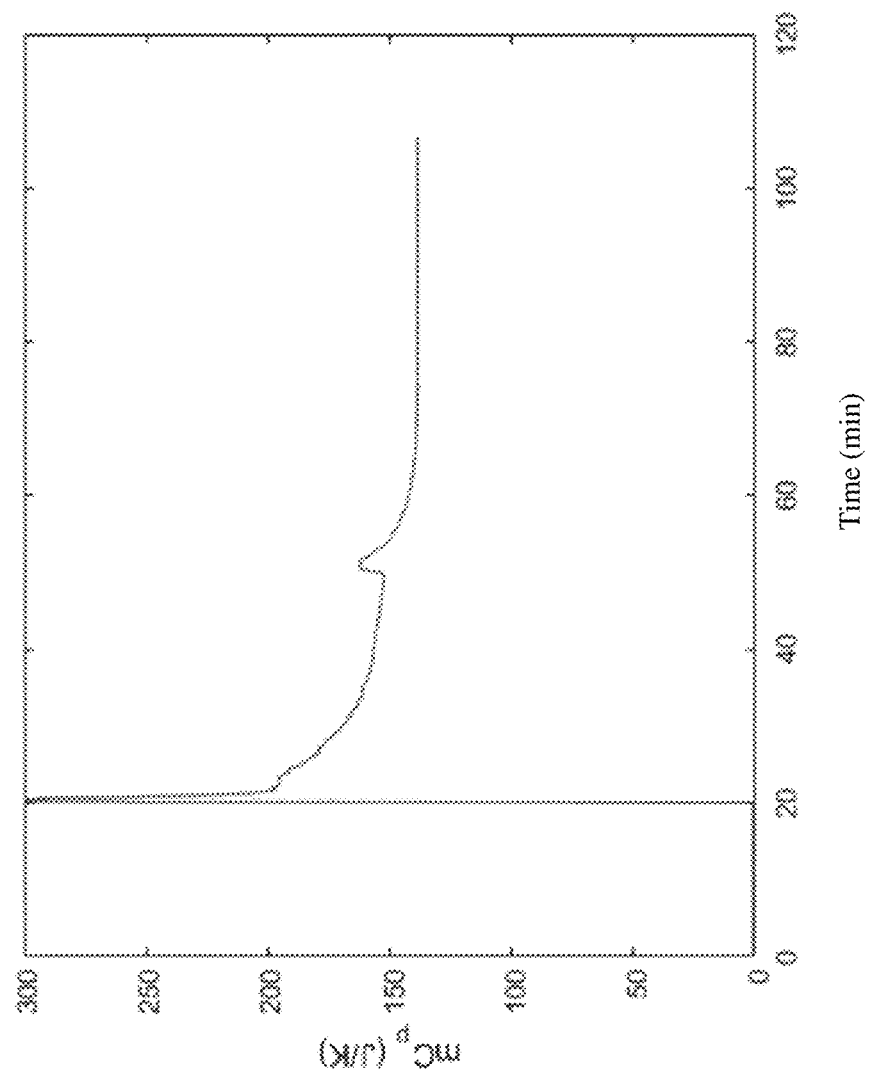
FIG. 4 is a curve of the estimation of the parameter $mC_p$ as a function of time.

The graph at the top of FIG. 4 is the response in temperature of the battery. The one at the bottom is the response in voltage. It is possible from these signals and from the RLS algorithm to estimate the desired parameters.

Figure 5:
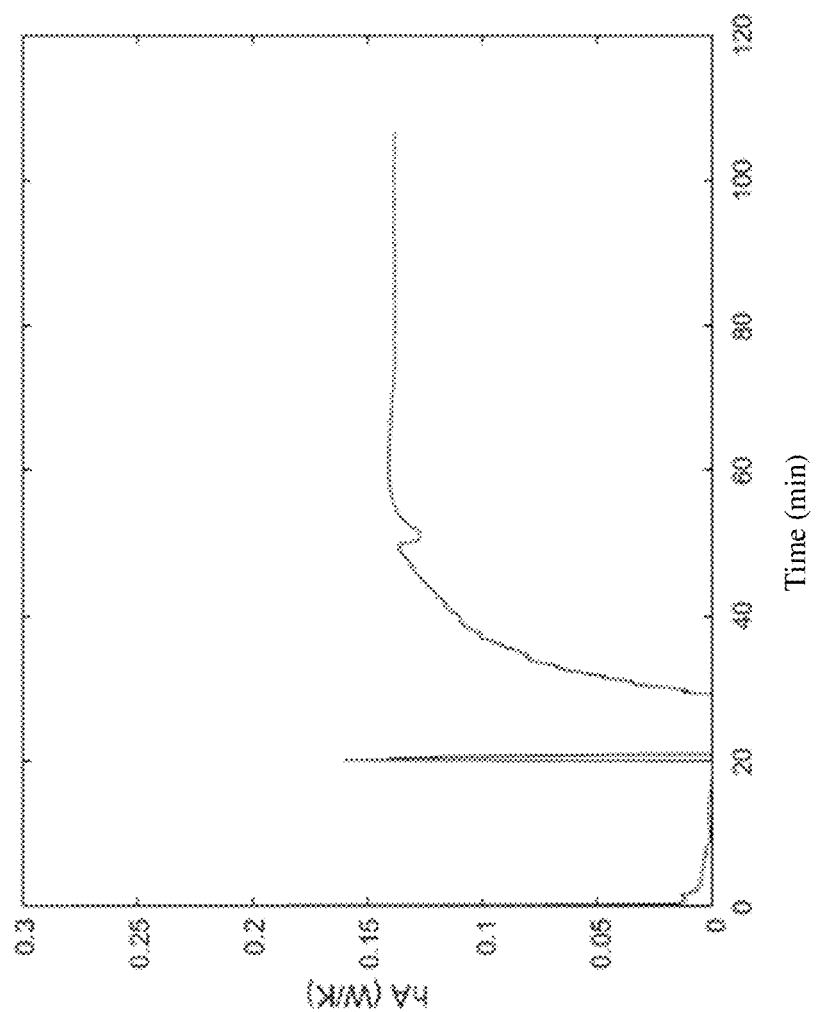
FIG. 5 is a curve of the estimation of the parameter hA as a function of time.
Figure 6:
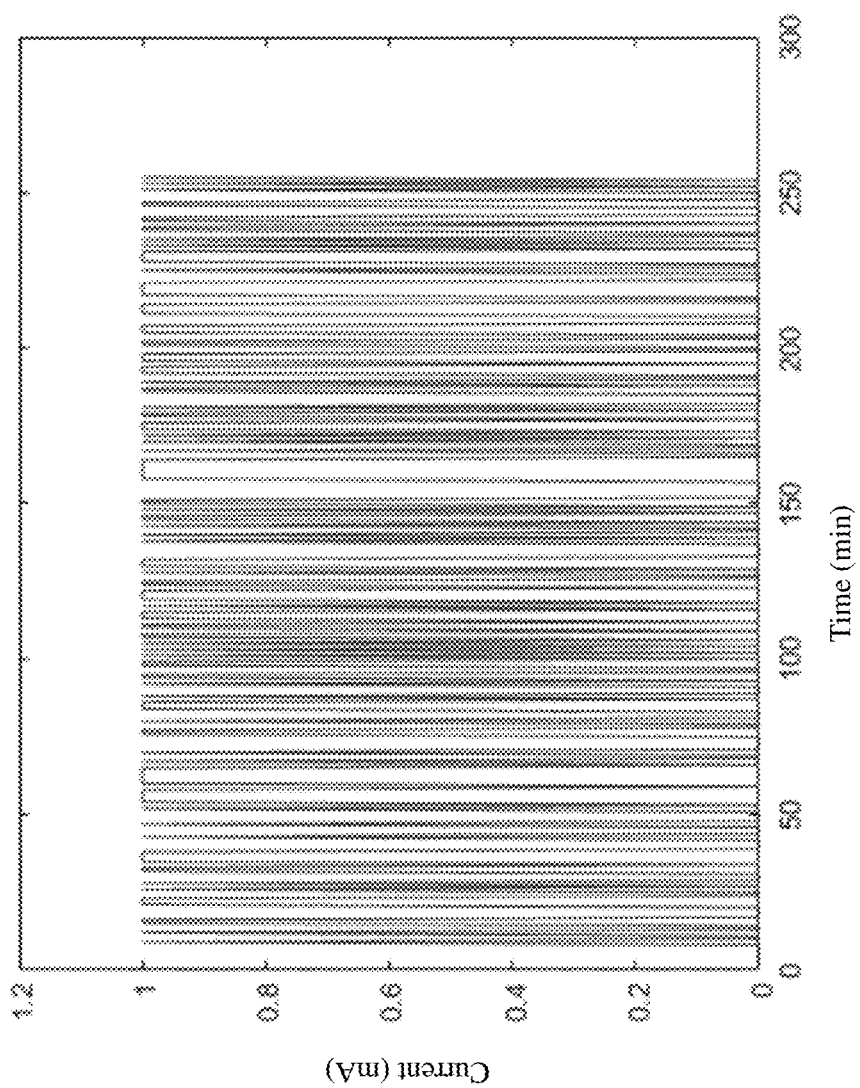
FIG. 6 shows the input current Se or charge current Sc constituted by a signal PRBS in A as a function of time (s).

FIGS. 4 and 5 show the convergence of these two parameters. The following values are obtained: $mC_p$=110JK$^{-1}$·h.A=0.09 WK$^{-1}$ FIGS. 5 and 6 show the convergence of these two parameters. The following values are obtained: •$mC_p$=110 JK$^{-1}$ •hA=0.09 WK$^{-1}$ This estimation is then integrated into the thermal model. The other parameters can then be estimated.

Steps (a) of Charging and (b) of Discharging

A pseudo random binary sequence (PRBS) is applied as input current of the battery, in order to charge it. For example, a PRBS signal is generated between 0A and 1A such as the one shown in FIG. 6, and it is repeated. The battery reaches a "C rate" of 0.3.C. The same process if carried out for the discharging, the signal Sd is between 0A and −1A.

Step (e) of the Periodic Estimation of the Electrical Model

Figure 7:
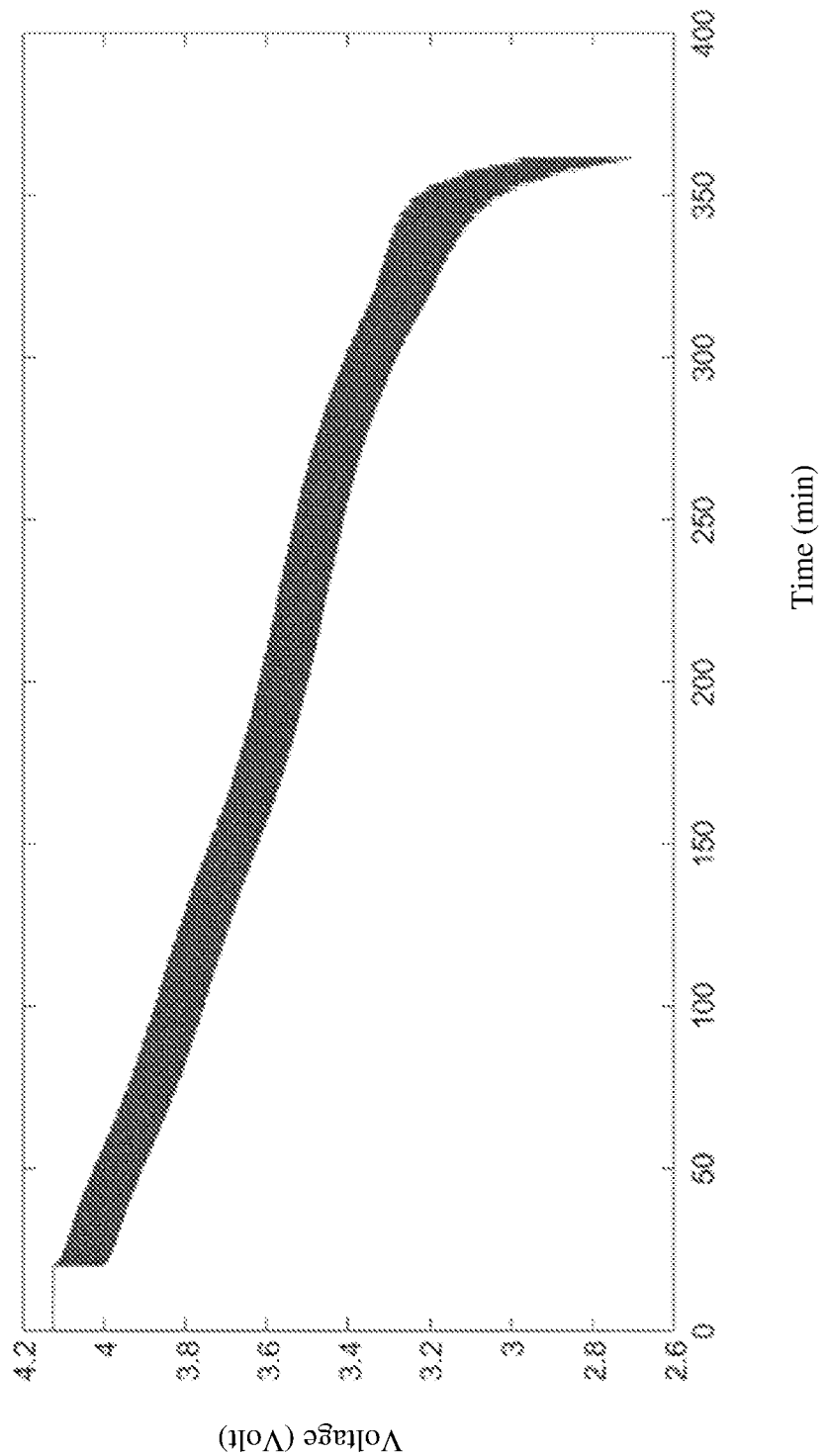
FIG. 7 shows the response in voltage (V) of a battery 18650 to the current, in the example, for the purposes of estimating $R_0$ and OCV.

A current is applied such as described in the preceding paragraph at the input of our battery system. We start with discharging the battery that initially was fully charged. The response in voltage can be seen in FIG. 7.

The interesting parameters of the electrical model governed by the equation 1 are $R_0$ and OCV. $R_0$ is a useful parameter and often used for an estimation of the ageing of the battery. OCV is useful for the thermal model, this will make it possible to estimate ΔS better.

Figure 8:
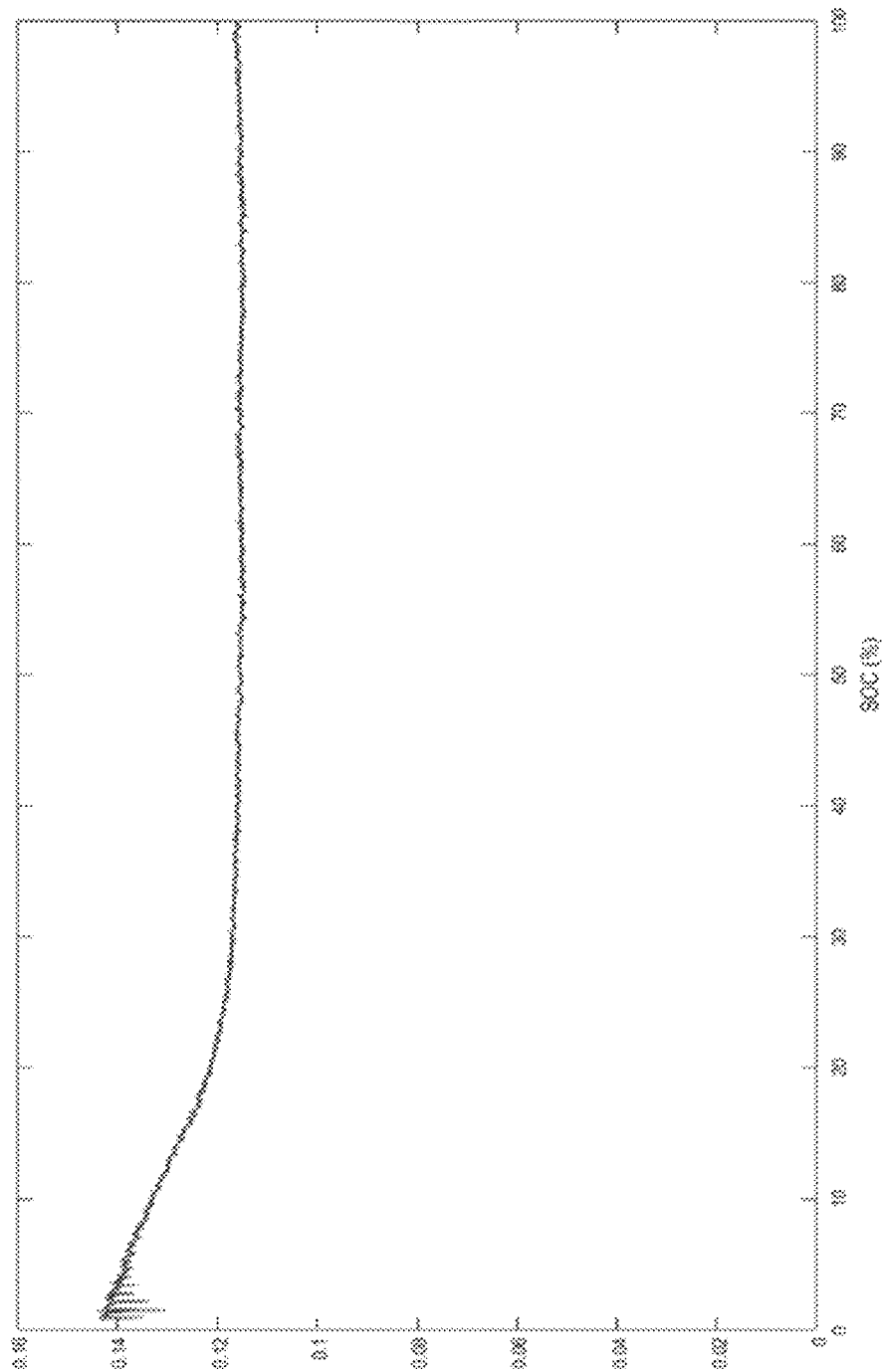
FIG. 8 shows an estimation of $R_0$(ohms) according to the state of charge SOC (%) during discharging.

The RLS algorithm is then applied to the data in order to estimate the parameters of the model. The parameters are updated every 0.2 seconds. FIG. 8 shows the estimation of $R_0$ according to the state of charge. The state of charge is defined thanks to the coulomb counting method. This consists of following the current by integrating it during the use of the batteries. This integration indirectly gives the quantity of electrical charges injected or withdrawn from the battery thus making it possible to precisely quantify the state of charge of the battery.

Figure 9:
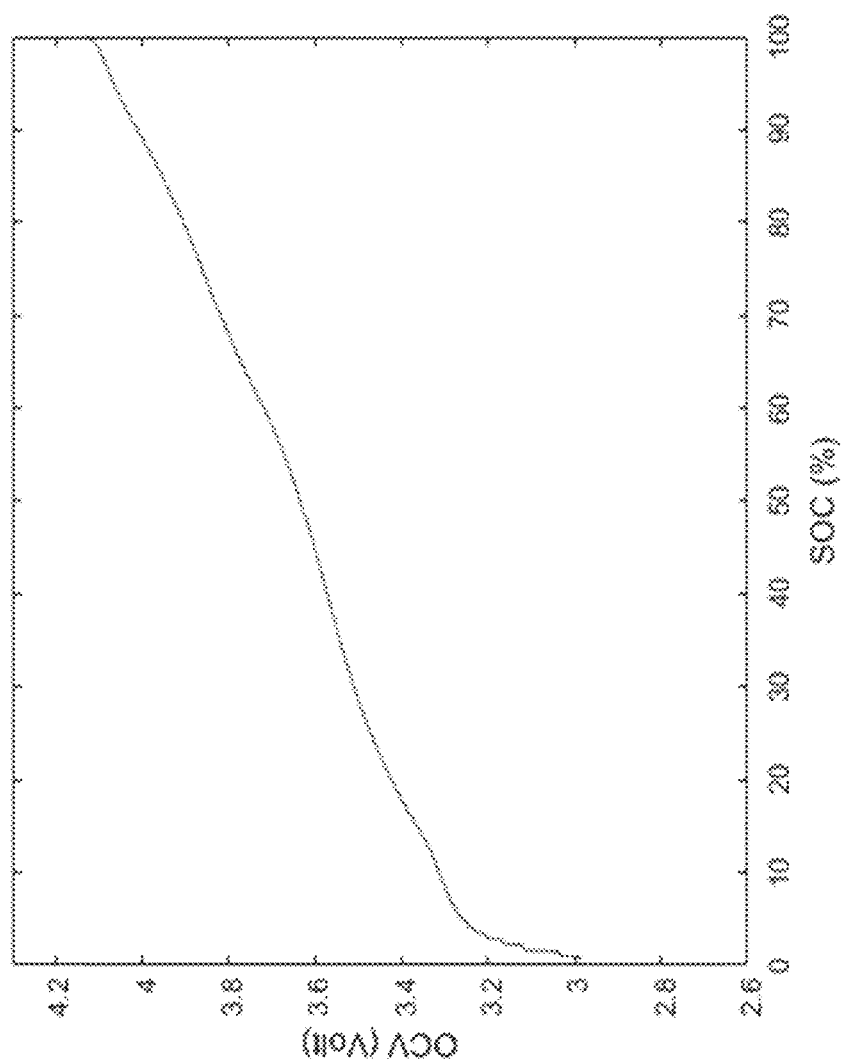
FIG. 9 shows an estimation of OCV (V) according to the state of charge SOC (%) during discharging.

Likewise, FIG. 9 shows the estimation of OCV.

Step (g) Periodic Estimation of the Thermal Model

Figure 10:
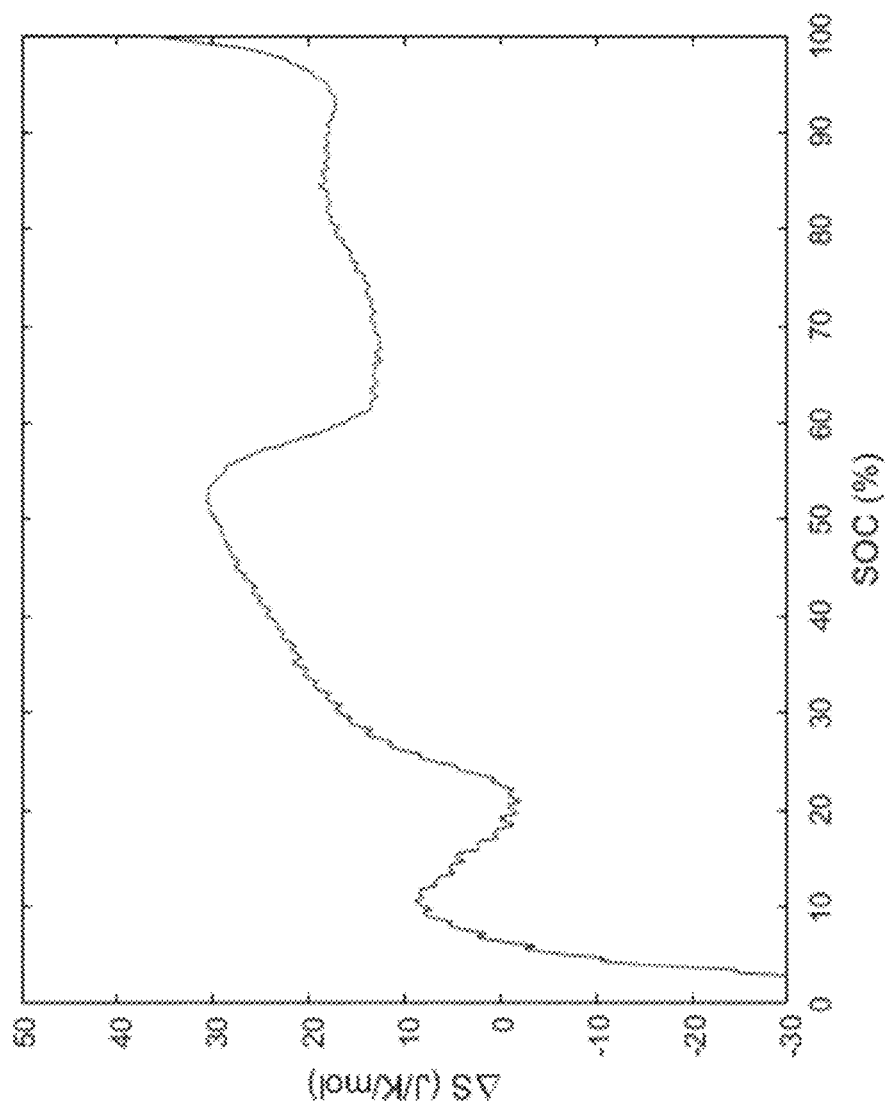
FIG. 10 is a curve of ΔS (J/K/mol) according to the state of charge SOC (%) during discharging.

As shown in FIG. 2, the RLS algorithm for the periodic estimation of the electrical model works at the same time as the RLS algorithm for the periodic estimation of the thermal model. The first, as said hereinabove will estimate OCV from the current and the voltage. This estimation will be used by a second RLS algorithm based on the thermal model and using the temperature for the purpose of estimating ΔS. Note that as the electrical dynamics are much faster than the thermal dynamics, the frequency used to update the electrical parameters is higher than for the thermal parameters. This estimation in FIG. 10 is thus obtained for ΔS as a function of the state of charge of the battery. A piece of information to be added is the time taken to obtain the complete profile. As the current is on the average 0.5 A, 6 hours were required.

Figure 11:
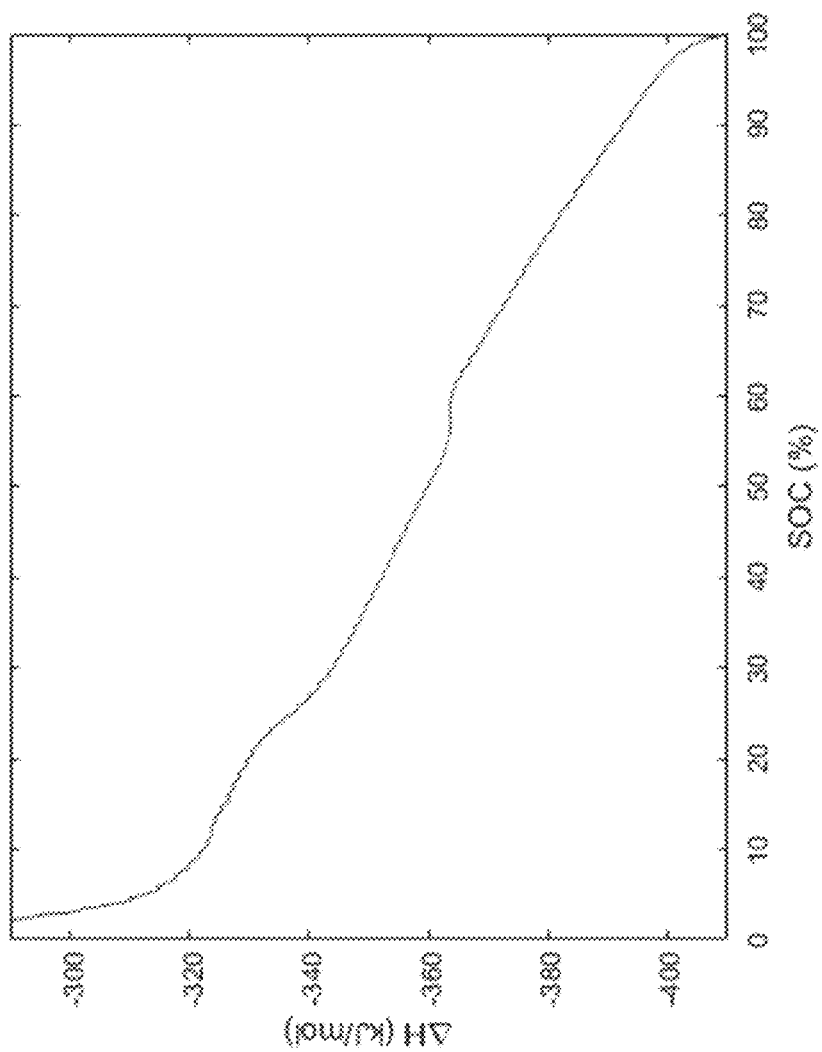
FIG. 11 is a curve of ΔH (kJ/mol) according to the state of charge SOC (%) during discharging.

It is also possible to obtain an estimation of the enthalpy ΔH (see FIG. 11) because the latter can be calculated from OCV and ΔS in the following way: ΔH=−F·OCV−T$_{bat}$ΔS An estimation of the thermodynamic data (OCV, ΔS and ΔH) in real time with a recursive algorithm has therefore been carried out. It is now necessary to compare these estimated profiles with the profiles measured by the standard method, ETM (electro-chemical thermodynamic measurement).

Comparative Example With the Method ETM

Test Bench

Figure 12:
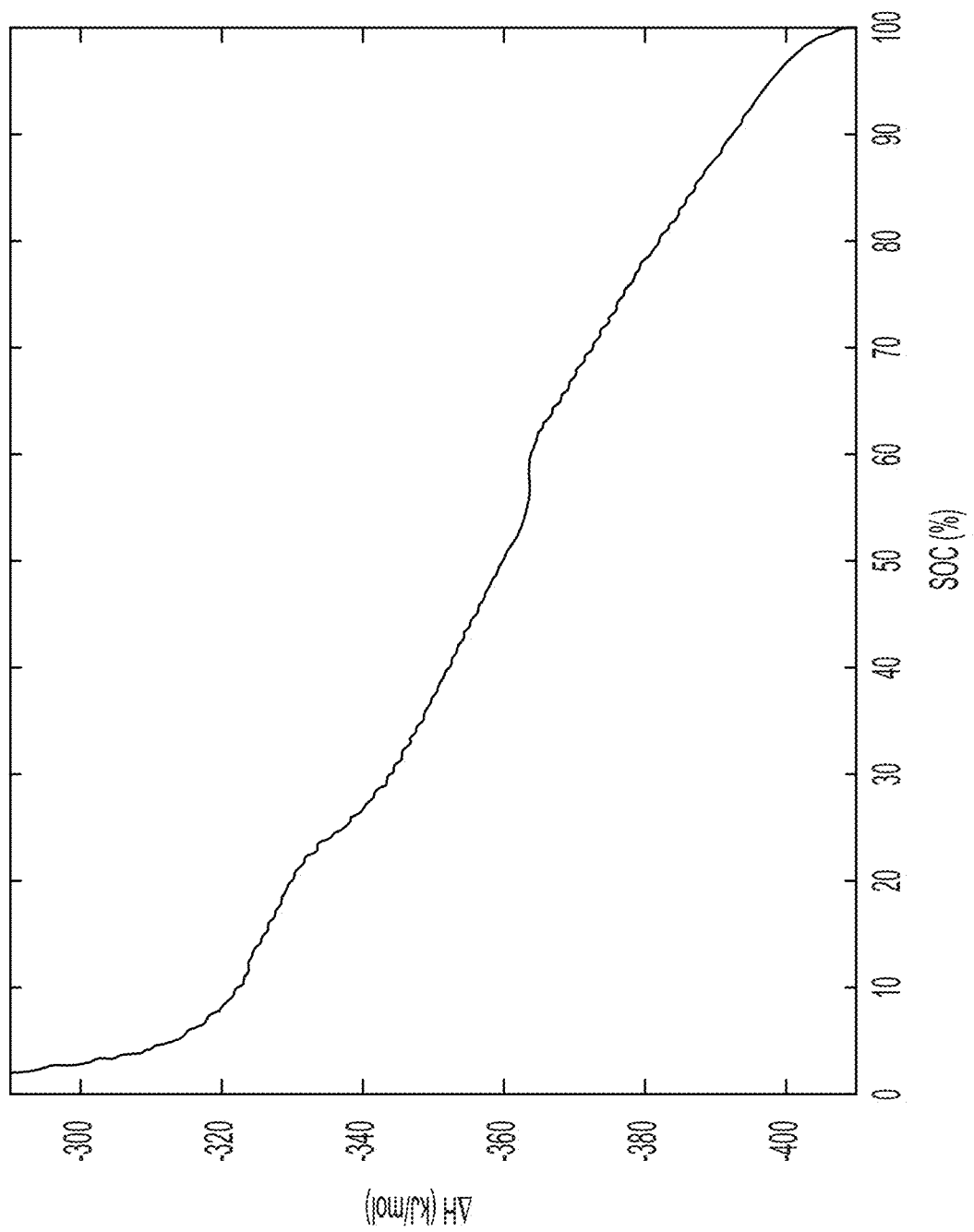
FIG. 12 shows the test bench for a standard measurement of the thermodynamic data in the comparative example.

For the purposes of making a comparison with the standard method, a test bench is manufactured to take the measurement. A diagram of this bench can be found in FIG. 12. It is mainly composed of 9 elements:
1. A battery identical to the one used on the example according to the invention.
2. A battery charger identical to the one used in the example according to the invention.
3. A 10 kΩ thermistor to measure the temperature of the battery.
4. A metal case containing the battery.
5. A Peltier element in contact with the case in order to change the temperature of the latter.
6. A radiator to remove the heat.
7. A fan to cool the radiator.
8. A Peltier driver to control the temperature of the battery.
9. A raspberry pi 3 to control the charger and the Peltier driver (therefore control the temperature of the battery). It is also used to record the data for the current, temperature and voltage of the battery.

Measurement of Thermodynamic Data

To measure ΔS the following formula is used as a basis:

$$\Delta S = F\left(\frac{\partial OCV}{\partial T_{bat}}\right)_x$$

ΔS is the variation in entropy
F is the Faraday constant
OCV is the open circuit voltage
T$_{bat}$ is the temperature of the battery
x is the state of charge In practice, to measure ΔS a given state of charge is used to start with, the current is cut off and several hours are allowed to pass so that the voltage relaxes and tends to OCV. Then the temperature of the battery is made to vary, which will have for effect to vary the voltage (this variation is very low, the measurement must be taken at high resolution). If there is no change in phase (change in the crystalline structure inside the anode or the cathode), there is a linear relationship between T$_{bat}$ and OCV. It remains simply to determine the coefficient that links the two and to multiply it by the Faraday constant to obtain ΔS. To obtain a complete profile, the measurement must be reiterated at different states of charge.

Figure 13:
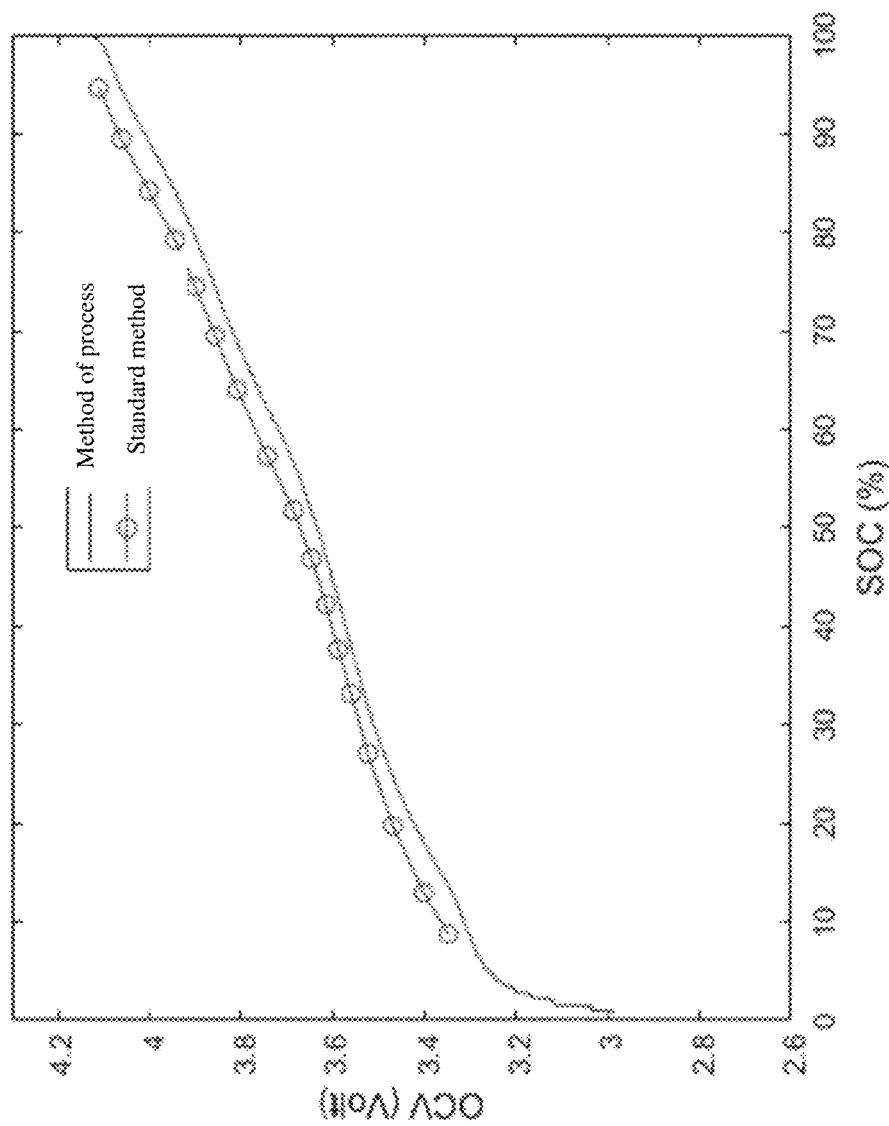
FIG. 13 shows comparative curves of profiles of OCV(V) according to the state of charge SOC (%) obtained by the method according to invention ("online method") and by ETM in a comparative example (standard method) during discharging.
Figure 14:
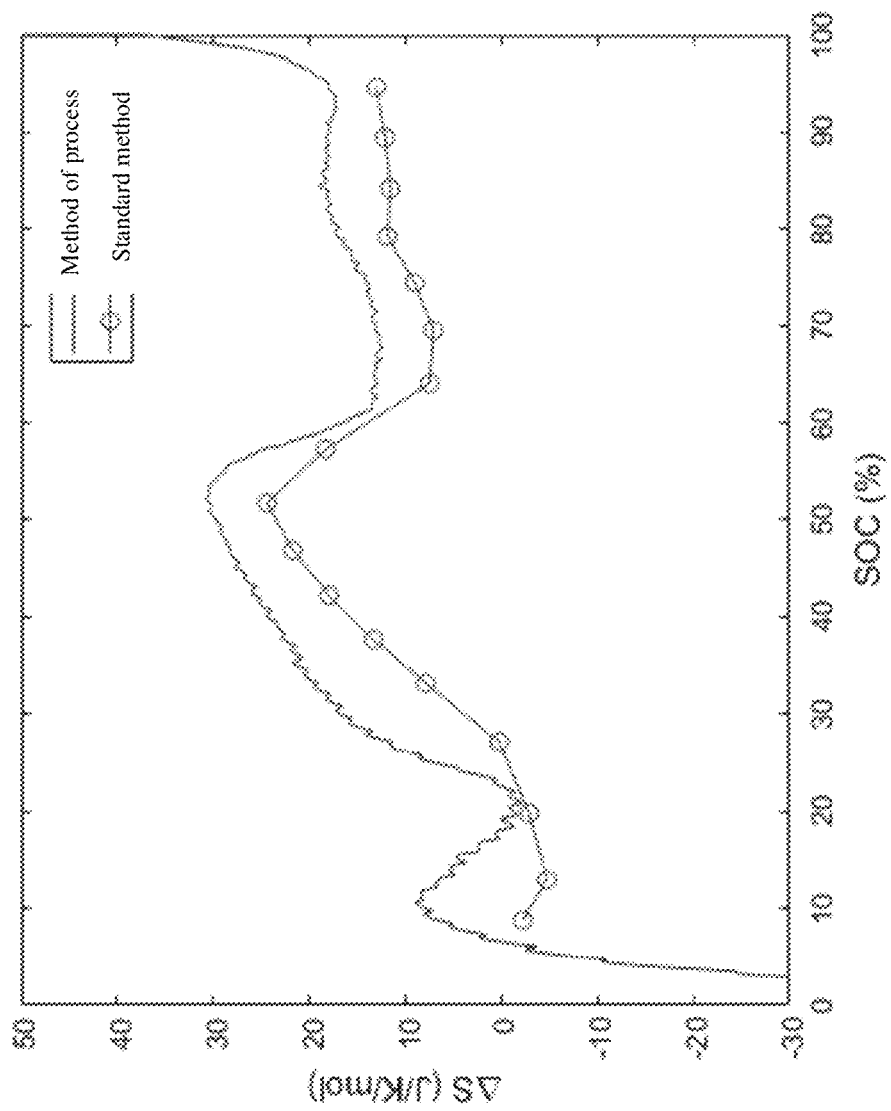
FIG. 14 shows comparative curves of profiles ΔS (J/K/mol) according to the state of charge SOC (%) obtained by the method according to invention (online method) and by ETM in the comparative example (standard method) during discharging.
Figure 15:
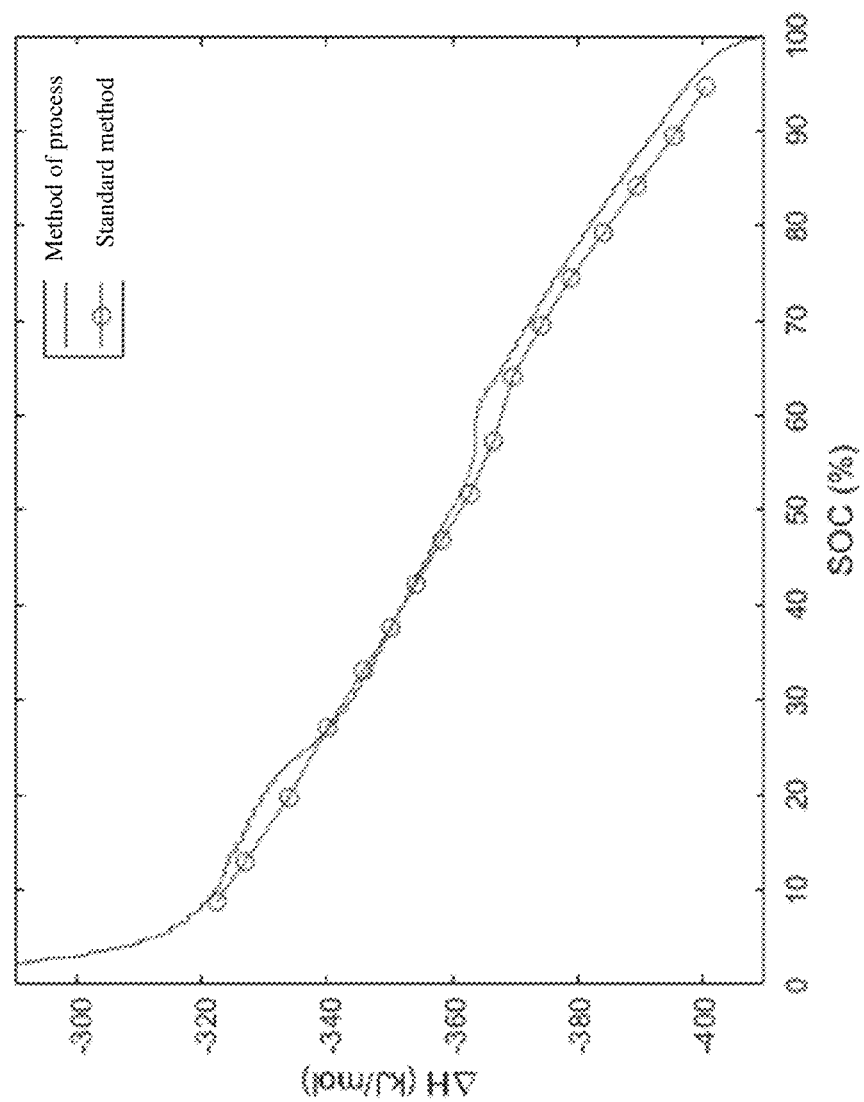
FIG. 15 shows comparative curves of profiles ΔH (KJ/mol) according to the state of charge SOC (%) obtained by the method according to invention (online method) and by ETM in the comparative example (standard method) during discharging.

OCV is obtained directly by measuring the voltage after relaxation and ΔH is obtained using the equation: ΔH=−F·OCV−T$_{bat}$ΔS Comparison The profiles obtained with the standard method and the online method shall now be compared. FIGS. 13, 14, and 15 make it possible to compare these two methods. Note that there is a bias between OCV measured online according to invention and that measured after relaxation according to the comparative example. This bias is then passed on to the estimation of ΔH and ΔS.

Another important aspect of the comparison is the measurement time to obtain a complete profile. With the method ETM of the comparative example, 5 days are required. With the method according to invention: 6 hours. More than one order of magnitude is gained.

Repeatability

Figure 16:
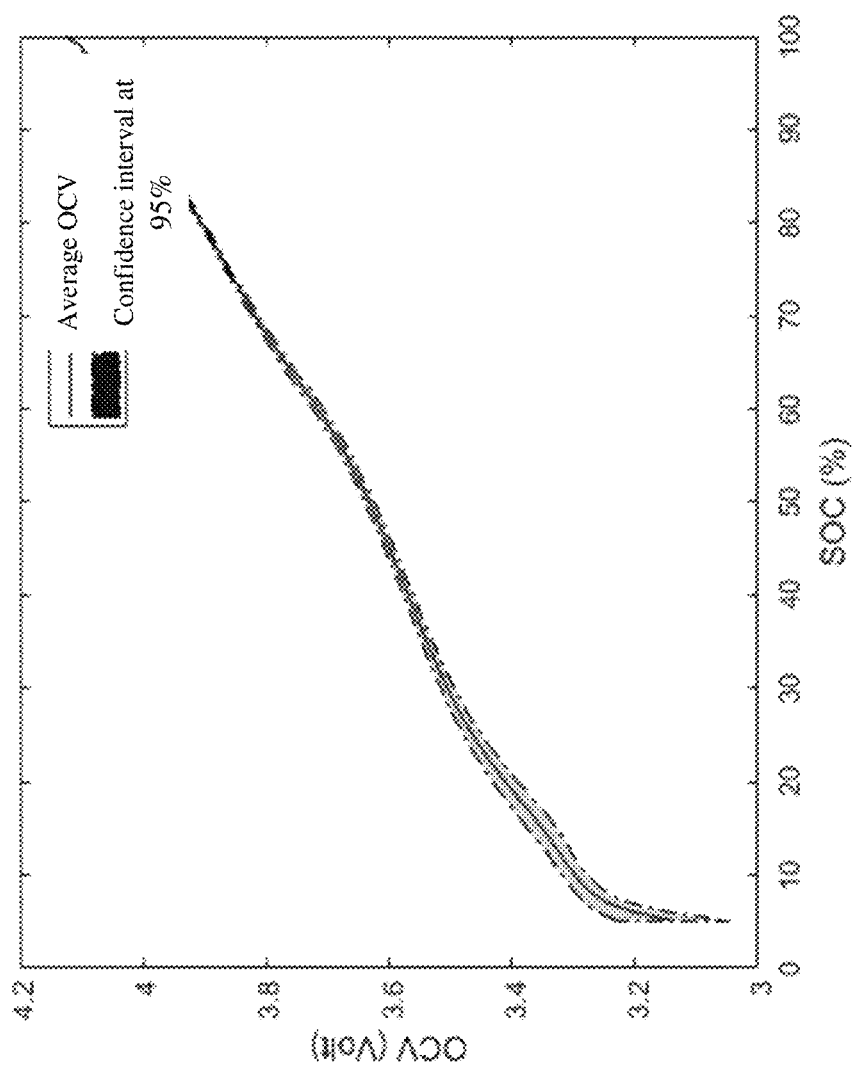
FIG. 16 shows curves of OCV (V) according to the state of charge SOC (%) obtained by the method according to invention, measured several times in the same conditions.
Figure 17:
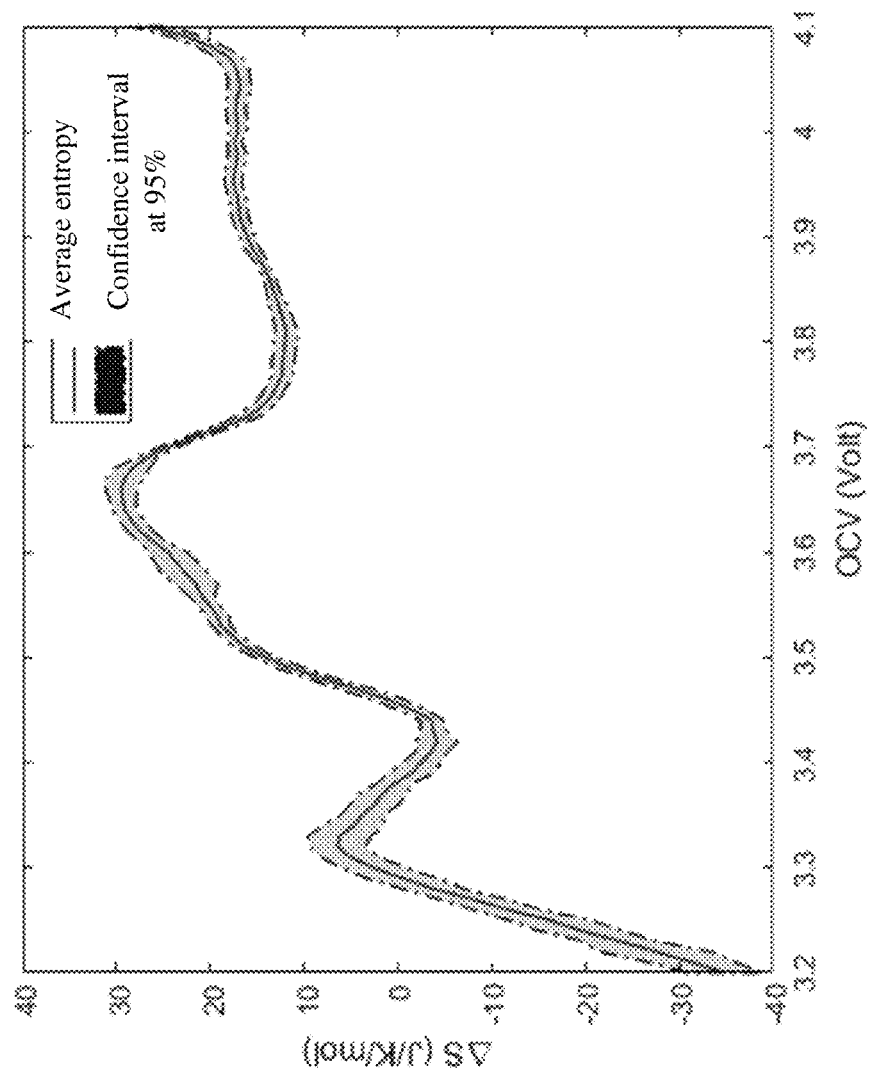
FIG. 17 shows curves ΔS (J/K/mol) as a function of OCV (V) obtained by the method according to invention, measured several times in the same conditions.
Figure 18:
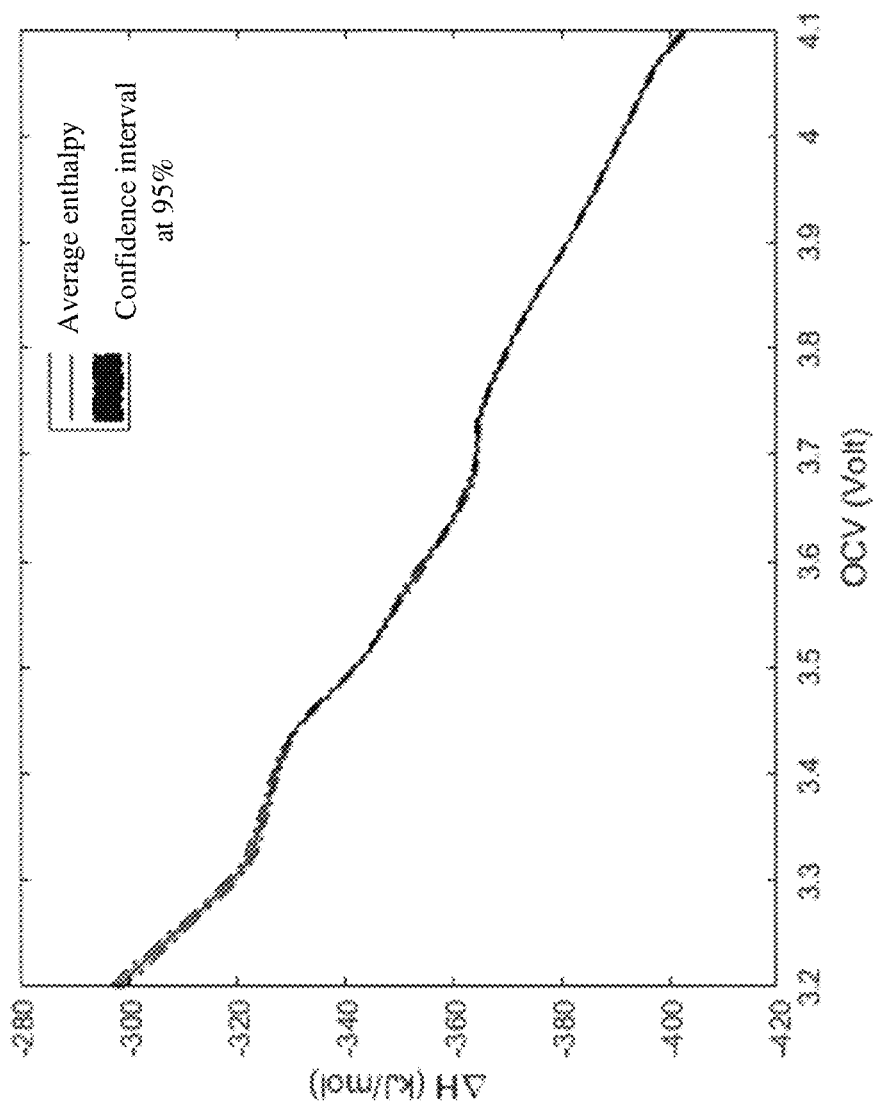
FIG. 18 shows curves ΔH (kJ/mol) as a function of OCV (V) obtained by the method according to invention, measured several times in the same conditions.

An important characteristic to be determined is the repeatability of the method according to the invention. There is therefore for the same battery estimated several times (7 times) the thermodynamic profiles during discharging. The average profiles and their confidence interval at 95% were then plotted. This is what can be observed in FIGS. 16, 17, and 18.

More than perfect compatibility with the profile measured with the standard method, what is important is to ensure that the measurement of the online profile according to invention, is repeatable. Indeed, this profile can then be used to estimate the state of health of the battery and it is its variation over time that is important in this respect. Likewise, to estimate the state of charge, it is its repeatability that is important.

The invention claimed is:

1. A method for measuring, in situ, online and in real time, thermodynamic data including a variation in entropy ΔS, of at least one battery, the method comprising:
   a modelling phase: producing a prior model of the battery of which a state of charge (SOC) is comprised between 0 and 100% by implementing:
      step (a) charging the battery at least partially with a charge current signal Sc, wherein the step (a) is optionally followed by a step (b) discharging the battery at least partially with a discharge current signal Sd;
      step (c) measuring actual variables useful in the following steps;
      step (d) modelling electrical behaviour of the battery during the charging step (a) with the charge current signal Sc and/or the discharging step (b) with the discharge current signal Sd, in order to estimate electrical parameters of the battery;
      step (e) estimating periodically, at a first alternating current frequency Fe, the electrical parameters of the battery;
      step (f) modelling thermal behaviour of the battery during charging in the step (a) with the charge current signal Sc and/or discharging in the step (b) with the discharge current signal Sd, in order to estimate in situ, online and in real time, at least one of parameters of a thermal model, namely ΔS;
      step (g) estimating periodically, at a second alternating current frequency Fg, the at least one of the parameters of the thermal model ΔS, by using at least one of the electrical parameters estimated in the step (e); and
   an estimating phase:
      estimating thermodynamic data including ΔS of the battery during use in an application and with any state of charge, by implementing an electrical model in the step (d) and the thermal model in the step (f) of the modelling phase, estimating electrical parameters in the step (e), and
estimating at least one of the parameters of the thermal model ΔS in the step (g),
wherein
the modelling in the step (d) consists in considering that the battery is an electrical circuit or the electrical model comprising a resistor $R_0$, an open circuit voltage OCV, and a circuit $R_1C_1$ in series, the electrical behaviour of the battery being described, in this electrical model, by the following equations:

$$\begin{cases} \dot{U}_1 = -\frac{1}{C_1R_1}U_1 + \frac{1}{C_1}I \\ V_{bat} = OCV + U_1 + R_0I \end{cases} \quad (1)\\(2)$$

where $U_1$ is a voltage at terminals of the circuit $R_1C_1$, I is a current passing through the battery and $V_{bat}$ a voltage at terminals of the battery, the equation (2) being discretised as follows:

$$V_{bat,k}=I_k b_{0,k}+I_{k-1}b_{1,k}+a_{1,k}(OCV_{k-1}-V_{bat,k-1})+OCV_k \quad (2')$$

and thus rewritten:

$$V_{bat,k} = \Theta_k^T \Phi_k \quad (2'')$$

with:

$$\begin{cases} \Theta_k^T = [\,b_{0,k} \quad b_{1,k} \quad a_{1,k} \quad OCV_k\,] \\ \Phi_k^T = [\,I_k \quad I_{k-1} \quad (OCV_{k-1} - V_{bat,k-1})\,] \end{cases}$$

where:

$$\begin{cases} b_0 = R_0 \\ b_1 = -R_0 + \frac{T_s}{C_1} + \frac{T_s R_0}{C_1 R_1} \\ a_1 = \frac{T_s}{C_1 R_1} - 1 \end{cases}$$

$T_s$ is a sampling period of a periodic input electrical signal $S_e$, and
$\Theta_k^T$ is a parameter vector,
the modelling in the step (f) comprises considering the battery as the thermal model, wherein the battery is subjected to a charge current Sc able to be subjected to a sampling or to a discharge current Sd able to be subjected to a sampling, and the battery is a heat exchanger with its environment,
the thermal behaviour of the battery is described by the following equation:

$$mC_p \frac{dT_{bat}}{dt} = I(V_{bat} - OCV) + IT_{bat}\frac{\Delta S}{F} + hA(T_{bat} - T_{amb}) \quad (3)$$

where:
m is a mass of the battery,
$C_p$ is a heat capacity of the battery,
$T_{bat}$ is a temperature of the battery,
t is a time variable,
I is the current passing through the battery,
$V_{bat}$ is the voltage at the terminals of the battery,
OCV is the open circuit voltage of the battery,
ΔS is the variation in entropy of the battery,
F is the Faraday constant,
h is the thermal exchange coefficient with the exterior,
A is the area of the battery in contact with the exterior,
$T_{amb}$ is the temperature of the outside environment,
the equation (3) being discretised as follows:

$$T_{bat,k}-T_{bat,k-1}=a_{0,k}[I_k(V_{bat,k}-OCV_k)]+a_{1,k}I_k T_{bat,k}+a_{2,k}(T_{bat,k}-T_{amb,k}) \quad (4)$$

and thus rewritten:

$$T_{bat,k} - T_{bat,k-1} = \Theta_k^T \Phi_k \quad (5)$$

with:

$$\begin{cases} \Theta_k^T = [\,a_{0,k} \quad a_{1,k} \quad a_{2,k}\,] \\ \Phi_k = [\,I_k(V_{bat,k} - OCV_k) \quad I_k T_{bat,k} \quad T_{bat,k} - T_{amb,k}\,] \end{cases}$$

where:

$$\begin{cases} b_0 = \frac{T_s}{mC_p} \\ b_1 = \frac{T_s \Delta S}{mC_p F} \\ a_1 = \frac{T_s hA}{mC_p} \end{cases} \text{or} \begin{cases} mC_p = \frac{T_s}{a_0} \\ \Delta S = \frac{a_1 F}{a_0} \\ hA = \frac{a_2}{a_0} \end{cases}$$

$T_s$ is the measurement sampling period,
the variation in entropy ΔS of the battery is measured, in situ, online and in real time, and used as an input of a battery management system associated at least with said battery, in order to provide feedback to the battery management system thus allowing this latter for controlling the battery in situ, online and in real time at least in function of the measured variation in entropy ΔS of the battery,
in the charging step (a), the charge current signal Sc is repetitively applied, of which a frequency range is comprised between 0 and 1 Hz, the charge current signal being chosen in such a way that a capacity ratio of the battery is comprised between 0.01C and 3C, and
in the discharging step (b), the discharge current signal Sd is repetitively applied which is an input current Se, of which a frequency range is comprised between 0 and 1 Hz.

2. The method according to claim 1, wherein the products $mC_p$ and hA are constant and are estimated in a step ($a_0$) prior to the step (a), and the step ($a_0$) comprises:
implementing a relaxation of the battery so that the parameter OCV of the equation (2') of the electrical model, has a precise given value;
applying the periodic input electrical signal $S_e$ of which the period is chosen in such a way that the average of the heat generated by ΔS over a period is about 0;
estimating the products $mC_p$ and hA, using a recursive least-squares algorithm, thanks to the equation (3) that has become the following equation (3'):

$$mC_p \frac{dT_{bat}}{dt} = I(V_{bat} - OCV) + hA(T_{bat} - T_{amb}) \quad (3')$$

and by measuring actual variables that correspond to the parameters $V_{Bat}$, I, $T_{bat}$, $T_{amb}$;
integrating this estimate of products $mC_p$ and hA into the thermal model for the steps (f) and (g).

3. The method according to claim 1, wherein the actual variables measured in the step (c) correspond to the parameters $V_{Bat}$, I, $T_{bat}$, $T_{amb}$ of the electrical and thermal models.

4. The method according to claim 2, wherein the periodic input electrical signal $S_e$ is a signal with a period comprised between 10 and 30 seconds.

5. The method according to claim 2, wherein the periodic input electrical signal $S_e$ is a zero average.

6. The method according to claim 1, wherein the estimating according to the step (e) is carried out using a recursive least-squares algorithm and the estimating according to the step (g) is carried out using a recursive least-squares algorithm.

7. The method according to claim 1, wherein the variation in enthalpy ΔH is estimated from OCV and ΔS using the following equation:

$$\Delta H = -F \cdot OCV - T_{bat}\Delta S \qquad (6).$$

8. A method for determining the state of charge and/or the state of health of the battery from ΔS and/or from ΔH measured or estimated by the method according to claim 7.

9. The method according to claim 1, further comprising:
  storing data estimated in the estimation phase and/or data measured in the modelling phase.

10. The method according to claim 1, wherein the charge current signal Sc is a signal corresponding to a Pseudo Random Binary Sequence (PRBS).

11. The method according to claim 1, wherein the discharge current signal Sd is a signal corresponding to a Pseudo Random Binary Sequence (PRBS).

12. A device for measuring, in situ, online and in real time, thermodynamic data including a variation in entropy ΔS, of at least one battery, the device comprising:
  at least one programmable charger/discharger;
  at least one sensor configured to detect at least one of actual variables that corresponds to the following parameters: $V_{Bat}$, I, $T_{bat}$, $T_{amb}$;
  at least one data recorder;
  at least one charge current signal generator; and
  at least one central control and calculation unit configured to control at least one of the at least one programmable charger/discharger, the at least one sensor, the at least one data recorder, or the at least one charge current signal generator, to
    produce a prior model of the battery of which a state of charge (SOC) is comprised between 0 and 100% by implementing:
      step (a) charging the battery at least partially with a charge current signal Sc, wherein the step (a) is optionally followed by a step (b) discharging the battery at least partially with a discharge current signal Sd;
      step (c) measuring the actual variables useful in the following steps;
      step (d) modelling electrical behaviour of the battery during the charging step (a) with the charge current signal Sc and/or the discharging step (b) with the discharge current signal Sd, in order to estimate electrical parameters of the battery;
      step (e) estimating periodically, at a first alternating current frequency Fe, the electrical parameters of the battery;
      step (f) modelling thermal behaviour of the battery during charging in the step (a) with the charge current signal Sc and/or discharging in the step (b) with the discharge current signal Sd, in order to estimate in situ, online and in real time, at least one of parameters of a thermal model, namely ΔS;
      step (g) estimating periodically, at a second alternating current frequency Fg, the at least one of the parameters of the thermal model ΔS, by using at least one of the electrical parameters estimated in the step (e);
    estimate thermodynamic data including ΔS of the battery during use in an application and with any state of charge, by implementing an electrical model in the step (d) and the thermal model in the step (f) of the modelling phase,
    estimate electrical parameters in the step (e), and
    estimate at least one of the parameters of the thermal model ΔS in the step (g),
  wherein
  the modelling in the step (d) consists in considering that the battery is an electrical circuit or the electrical model comprising a resistor $R_0$, an open circuit voltage OCV, and a circuit $R_1C_1$ in series, the electrical behaviour of the battery being described, in this electrical model, by the following equations:

$$\begin{cases} \dot{U}_1 = -\frac{1}{C_1 R_1}U_1 + \frac{1}{C_1}I & (1) \\ V_{bat} = V_{bat} = OCV + U_1 R_0 I & (2) \end{cases}$$

where $U_1$ is a voltage at terminals of the circuit $R_1C_1$, I is a current passing through the battery and $V_{bat}$ a voltage at terminals of the battery, the equation (2) being discretised as follows:

$$V_{bat,k} = I_k b_{0,k} + I_{k-1}b_{1,k} + a_{1,k}(OCV_{k-1} - V_{bat,k-1}) + OCV_k \qquad (2')$$

and thus rewritten:

$$V_{bat,k} = \Theta_k^T \Phi_k \qquad (2'')$$

with:

$$\begin{cases} \Theta_k^T = [b_{0,k} \ b_{1,k} \ a_{1,k} \ OCV_k] \\ \Phi_k^T = [I_k \ I_{1,k-1} \ (OCV_{k-1} - V_{bat,k-1})] \end{cases}$$

where:

$$\begin{cases} b_0 = R_0 \\ b_1 = -R_0 + \dfrac{T_s}{C_1} + \dfrac{T_s R_0}{C_1 R_1} \\ a_1 = \dfrac{T_s}{C_1 R_1} - 1 \end{cases}$$

$T_z$ is a sampling period of a periodic input electrical signal $S_e$, and
$\Theta_k^T$ is a parameter vector,
the modelling in the step (f) comprises considering the battery as the thermal model, wherein the battery is subjected to a charge current Sc able to be subjected to a sampling or to a discharge current Sd able to be subjected to a sampling, and the battery is a heat exchanger with its environment,
the thermal behaviour of the battery is described by the following equation:

$$mC_p \frac{dT_{bat}}{dt} = I(V_{bat} - OCV) + IT_{bat}\frac{\Delta S}{F} + hA(T_{bat} - T_{amb}) \qquad (3)$$

where:
m is a mass of the battery,
$C_p$ is a heat capacity of the battery,
$T_{bat}$ is a temperature of the battery,
t is a time variable,
I is the current passing through the battery, $V_{bat}$ is the voltage at the terminals of the battery,
OCV is the open circuit voltage of the battery,
ΔS is the variation in entropy of the battery,
F is the Faraday constant,
h is the thermal exchange coefficient with the exterior,
A is the area of the battery in contact with the exterior,
$T_{amb}$ is the temperature of the outside environment,
the equation (3) being discretised as follows:

$$T_{bat,k} - T_{bat,k-1} = a_{0,k}[I_k(V_{bat,k} - OCV_k)] + a_{1,k}I_kT_{bat,k} + a_{2,k}(T_{bat,k} - T_{amb,k}) \quad (4)$$

and thus rewritten:

$$T_{bat,k} - T_{bat,k-1} = \Theta_k^T \Phi_k \quad (5)$$

with:

$$\begin{cases} \Theta_k^T = [a_{0,k} \; a_{1,k} \; a_{2,k}] \\ \Phi_k = [I_k(V_{bat,k} - OCV_k) \; I_k T_{bat,k} \; T_{bat,k} - T_{amb,k}] \end{cases}$$

where:

$$\begin{cases} a_0 = \dfrac{T_s}{mC_p} \\ a_1 = \dfrac{T_s \Delta S}{mC_p F} \\ a_2 = \dfrac{T_s hA}{mC_p} \end{cases} \text{ or } \begin{cases} mC_p = \dfrac{T_s}{a_0} \\ \Delta S = \dfrac{a_1 F}{a_0} \\ hA = \dfrac{a_2}{a_0} \end{cases}$$

$T_s$ is the measurement sampling period,
the at least one central control and calculation unit is configured to estimate the products $mC_p$ and hA in a step ($a_0$) prior to the step (a), the products $mC_p$ and hA being constant,
the at least one central control and calculation unit is configured to perform the step ($a_0$) by
  implementing a relaxation of the battery so that the parameter OCV of the equation (2') of the electrical model, has a precise given value;
  applying the periodic input electrical signal $S_e$ of which the period is chosen in such a way that the average of the heat generated by ΔS over a period is about 0;
  estimating the products $mC_p$ and hA, using a recursive least-squares algorithm, thanks to the equation (3) that has become the following equation (3'):

$$mC_p \frac{dT_{bat}}{dt} = I(V_{bat} - OCV) + hA(T_{bat} - T_{amb}) \quad (3')$$

and by measuring the actual variables that correspond to the parameters $V_{Bat}$, I, $T_{bat}$, $T_{amb}$; and
  integrating this estimate of products $mC_p$ and hA into the thermal model for the steps (f) and (g),
  the at least one central control and calculation unit is configured to control at least one of the at least one programmable charger/discharger, the at least one sensor, the at least one data recorder, or the at least one charge current signal generator, to collect and to process data for the estimations of the steps ($a_0$), (e), and (g), by implementing recursive least-squares algorithms,
the device is configured to measure the variation in entropy ΔS of the battery, in situ, online and in real time, the variation being used as an input of a battery management system associated at least with said battery, in order to provide feedback to the battery management system thus allowing this latter for controlling the battery in situ, online and in real time at least in function of the measured variation in entropy ΔS of the battery,
the at least one programmable charger/discharger is configured to repetitively apply, in the charging step (a), the charge current signal Sc, of which a frequency range is comprised between 0 and 1 Hz, the charge current signal being chosen in such a way that a capacity ratio of the battery is comprised between 0.01C and 3C, and
the at least one programmable charger/discharger is configured to repetitively apply, in the discharging step (b), the discharge current signal Sd which is an input current Se, of which a frequency range is comprised between 0 and 1 Hz.

\* \* \* \* \*